US012763744B2

(12) United States Patent
Bopp et al.

(10) Patent No.: US 12,763,744 B2
(45) Date of Patent: Oct. 13, 2026

(54) RF CONTROL OF ACOUSTO-OPTIC DEFLECTOR

(71) Applicants: John Bopp, Bellwood, IL (US); John Lekavich, Bellwood, IL (US); Bao Tran, Saratoga, CA (US); Khanh Le, Bellwood, IL (US)

(72) Inventors: John Bopp, Bellwood, IL (US); John Lekavich, Bellwood, IL (US); Bao Tran, Saratoga, CA (US); Khanh Le, Bellwood, IL (US)

( * ) Notice: Subject to any disclaimer, the term of this patent is extended or adjusted under 35 U.S.C. 154(b) by 391 days.

(21) Appl. No.: 18/444,635

(22) Filed: Feb. 17, 2024

(65) Prior Publication Data

US 2025/0132743 A1 Apr. 24, 2025

Related U.S. Application Data

(63) Continuation-in-part of application No. 18/332,719, filed on Jun. 10, 2023, now Pat. No. 11,953,668.

(51) Int. Cl.

| | |
|---|---|
| ***H03G 3/30*** | (2006.01) |
| ***G02F 1/33*** | (2006.01) |
| ***H03F 1/56*** | (2006.01) |
| ***H03F 3/21*** | (2006.01) |
| ***H03F 3/213*** | (2006.01) |

(52) U.S. Cl.

CPC ............. *H03G 3/3036* (2013.01); *G02F 1/33* (2013.01); *H03F 1/565* (2013.01); *H03F 3/211* (2013.01); *H03F 3/213* (2013.01); *H03F 2200/09* (2013.01); *H03F 2200/387* (2013.01); *H03F 2200/451* (2013.01); *H03G 2201/103* (2013.01); *H03G 2201/307* (2013.01)

(58) Field of Classification Search

CPC ........... H03G 3/3036; H03G 2201/103; H03G 2201/307; G02F 1/33; H03F 1/565; H03F 3/211; H03F 3/213; H03F 2200/09; H03F 2200/387; H03F 2200/451

USPC .......................................................... 330/129

See application file for complete search history.

(56) References Cited

U.S. PATENT DOCUMENTS

| | | | | |
|---|---|---|---|---|
| 6,597,244 | B2 * | 7/2003 | Tichauer | H03F 1/0272 330/296 |
| 2004/0097189 | A1 * | 5/2004 | Bongfeldt | H04W 52/10 455/7 |
| 2011/0037516 | A1 * | 2/2011 | Nejati | H03F 3/72 330/124 R |
| 2014/0218106 | A1 * | 8/2014 | Drogi | H03F 3/24 330/129 |
| 2019/0020316 | A1 * | 1/2019 | Cheng | H01P 5/028 |
| 2020/0144978 | A1 * | 5/2020 | Park | H03F 1/56 |
| 2020/0212862 | A1 * | 7/2020 | Hulsteijn | H04B 1/0458 |

* cited by examiner

*Primary Examiner* — Hafizur Rahman

(74) *Attorney, Agent, or Firm* — PatentPC PowerPatent; Bao Tran

(57) ABSTRACT

An acousto-optic deflector includes an optical element having a surface with one or more steps formed thereon; a conductive layer formed on the surface with the steps; one or more crystals secured to each step; and electrodes positioned on each surface of each crystal.

20 Claims, 12 Drawing Sheets

RF CONTROL OF ACOUSTO-OPTIC DEFLECTOR

This application claims priority to co-pending, commonly filed applications on Apr. 7, 2023 with Ser. Nos. 18/132,025, 18/132,034, 18/132,047, 18/132,054, 18/132,058, 18/132,064, 18/132,069, 18/132,070, 18/132,074, the contents of which are incorporated by reference.

BACKGROUND

The present invention relates to an acousto-optic deflector system.

An acousto-optic deflector (AOD) is a device that can steer a laser beam in a specific direction through the use of an acoustic wave. The device is widely used in various applications, including microscopy, laser printing, laser scanning, laser drilling, and laser communication.

The AOD consists of an acousto-optic crystal, usually made of an optical material like germanium, tellurite, or silica, that is designed to propagate an acoustic wave through the crystal generated by an RF signal. When a laser beam is directed through the crystal, the acoustic wave creates a spatially varying refractive index in the crystal, which diffracts the laser beam in a specific direction.

The deflection angle of the laser beam is determined by the frequency and amplitude of the RF signal used to generate the acoustic wave. By varying these parameters, the deflection angle of the laser beam can be adjusted to scan a specific area or to perform a specific task.

One of the applications of AODs is microscopy. AODs can be used to steer a laser beam through a sample to aide in the generation of an image of the sample. This technique, known as laser scanning microscopy, allows for high-resolution imaging of biological samples and materials with minimal photodamage.

AODs are also used in laser printing, where they can be used to steer a laser beam to print high-resolution images and text onto a variety of materials, including paper, plastic, and metal.

Additionally, AODs can be used to direct high-optical power lasers to precise locations and to turn the laser power on and off facilitating laser drilling of holes, specifically in manufacture of printed circuit boards.

In laser communication, AODs can be used to steer a laser beam between a transmitter and a receiver. This technique, known as free-space optical communication, allows for high-speed data transfer over long distances without the need for physical connections.

Commonly, a radio frequency (RF) controller is needed to interface to customer equipment to the AOD input.

SUMMARY

In one aspect, an RF controller for an AOD includes a Variable Gain Amplifier (VGA) configured to control the overall gain of the RF power, an amplifier providing a fixed gain to a pre-amp stage, a multi-stage amplification system including a large signal driver stage and a final stage delivering the RF power signal, bi-directional couplers positioned between the final amplifier stage and the RF power output, enabling the sampling of forward and reverse power, RF power detectors converting sampled power into a DC voltage equivalent for feedback and control purposes, and a controller managing gain, bias currents, and shutdown based on feedback from the RF power detectors.

In implementations, the controller regulates the gain of the VGA and sets bias currents for specific amplifier stages via a Digital-to-Analog Converter (DAC), ensuring compensation over a wide operating temperature range. The final amplification stage is adaptable to deliver variable drive power levels beyond the standard 25-watt output, offering scalability for diverse operational requirements. The controller initiates an immediate shutdown of the RF driver upon detecting excessive forward or reflected power levels using feedback received from the RF power detectors. An RS485 communication interface enables exchange of system health and status information between the microcontroller and an external control unit for real-time monitoring and control of the driver performance.

In another aspect, an acousto-optic deflector includes an optical element having a surface with one or more steps formed thereon; a conductive layer formed on the surface with the steps; one or more crystals secured to each step; and one or more electrodes positioned on the surface of the one or more crystals.

Implementations of the above aspect can include one or more of the following. A tuning element can be used to match a predetermined impedance. The tuning element can provide an output impedance of 50 ohms for one use case. The tuning element can have inductive and capacitive passive components. In one embodiment, the tuning element can be a 1:1 balun, 4:1 transformer, a capacitor, and an inductor. The optical element comprises a slanted end. The tuning element matches a deflector output impedance at 40 MHz and at 60 MHz to a 50 ohm impedance. The slanted end can have a compound angle designed to drive the reflected sound field out of a laser beam working range so that no reflected sound wave can impact laser performance. In one specific design, the slanted end forms a 30 degree angle measured from a long side of the optical element to a short side of the optical element and the surface of the slanted end has a 2 degree slope. The optical element can be germanium, tellurium dioxide ($TeO_2$), lithium niobate, PZT, fused silica, chalcogenide glasses, or glass, for example.

In further aspect, a method to form a phased-array transducer includes

- grinding an optical element to form two or more steps each with a predetermined height;
- depositing a conductive layer (gold) over the one or more steps;
- attaching one or more crystals or transducers on the one or more steps; and
- attaching electrodes to the top and bottom of each transducer.

Implementations of the above aspect can include one or more of the following. The method includes matching the input of the transducers to a predetermined impedance. A tuning element can be connected to the transducers with an output impedance of 50 ohms. The tuning element includes inductive and capacitive passive components. The tuning element can have a 1:1 balun, a 4:1 transformer, a capacitor, and an inductor. The optical element can have a slanted end, wherein the slanted end comprises a compound angle to move reflected sound field out of a laser beam working range. The slanted end forms a 30 degree angle measured from a long side of the optical element to a short side of the optical element. A surface of the slanted end has a 2 degree slope. The optical element comprises germanium, tellurium dioxide ($TeO_2$), lithium niobate, PZT, fused silica, chalcogenide glasses, glass. The tuning element matches a deflector output impedance at 40 MHz and at 60 MHz to a 50 ohm impedance.

In another aspect, a method to deflect a laser beam includes:

applying the laser beam to an optical element having one or more steps each with a predetermined height and one or more crystals or transducers on the one or more steps;

impedance matching the electrical input of the transducers to a 50-ohm load;

providing an electrical input to deflect the laser at the two or more frequencies; and generating a sound field in the optical element to deflect a laser beam based on two or more frequencies.

In a further aspect, a method to form an opto-acoustic deflector includes grinding an optical element to provide one or more steps each with a predetermined height;

depositing a layer of gold over the one or more steps; and attaching one or more crystals or transducers on the one or more steps.

Implementations of the above aspect can include one or more of the following. The method includes tuning the electrical output for 40 MHz and 60 MHz output. A slanted end is formed on the optical element with a compound angle to move reflected sound field out of a laser beam working range. The slanted end forms a 30 degree angle measured from a long side of the optical element to a short side of the optical element. A surface of the slanted end comprises a 2 degree slope.

In another aspect, a method to form and to operate an opto-acoustic deflector includes:

grinding an optical element to form one or more steps each with a predetermined height;

depositing a conductive layer (gold) over the one or more steps;

attaching one or more crystals or transducers on the one or more steps;

attaching electrodes to the top and bottom of each transducer;

impedance matching the electrical input of the transducers to a 50-ohm load;

receiving an electrical input to deflect the laser at the two or more frequencies; and generating a sound field in the optical element to deflect a laser beam based on two or more frequencies.

Implementations can include one or more of the following. The method can include tuning the electrical output for 40 MHz and 60 MHz output. The method includes forming a slanted end on the optical element. The method further includes forming a compound angle to move reflected sound field out of a laser beam working range. The slanted end forms a 30 degree angle measured from a long side of the optical element to a short side of the optical element. A surface of the slanted end comprises a 2 degree slope. The method includes grinding the optical element, which can be germanium, tellurium dioxide (TeO2), lithium niobate, PZT, fused silica, chalcogenide glasses, glass, among others.

In another aspect, a radio frequency (RF) system includes:

a Variable Gain Amplifier (VGA) configured to control the overall gain of the RF power;

an amplifier providing a fixed gain to a pre-amp stage;

a multi-stage amplification system including a large signal driver stage and a final stage delivering the RF power signal;

bi-directional couplers positioned between the final amplifier stage and the RF power output, enabling the sampling of forward and reverse power;

RF power detectors converting sampled power into a DC voltage equivalent for feedback and control purposes; and a controller managing gain, bias currents, and shutdown based on feedback from the RF power detectors.

In implementations, the controller regulates a gain of the VGA and sets bias currents for one or more amplifier stages with a Digital-to-Analog Converter (DAC) for compensation over a predetermined operating temperature range. An amplification stage coupled to the controller to deliver variable drive power levels to provide scalability for one or more operational requirements. The controller initiates an immediate shutdown of an RF driver upon detecting one or more predetermined forward or reflected power levels using feedback received from the RF power detectors. A serial communication interface enabling exchange of system health and status information between the microcontroller and an external controller.

Advantages of the system may include one or more of the following. This product has several key features. The RF power amplifier is microcontroller-based, allowing precise gain adjustment, superior temperature compensation, and autonomous fault recovery capabilities. The RF power amplifier has redundant fault detection for excessive forward and reverse power. One is a slower, measurement-based power detection means and the other is a faster, threshold-based power detection means. This fault detection scheme protects an already rugged power amplifier from harsh environments and ensures reliable operation. The RF power amplifier also monitors its operating temperature to maintain consistent RF power output. This is essential for many acousto-optic applications where consistent RF power output improves laser system performance.

The Interface Board provides a proprietary, optically isolated interface that provides a programmable configuration to interface with end user equipment. This interface allows rapid changeover when connecting to end user equipment. The interface provides a means for diagnostic feedback to end user equipment for system level diagnostics.

The DDS Engine is microcontroller-based, allowing precise frequency and amplitude control while providing a secondary means for fault protection. It provides the end user equipment control over RF power level and RF frequency. The DDS Engine works with the Interface Board and RF Power Amplifier to provide diagnostic feedback to end user equipment.

The deflector can operate with two distinct frequencies, for example at 40 and 60 MHZ, resulting in a single device that can do the job of two. The deflector thus is smaller, lower power, and higher matching behavior over versions that require two separate deflectors each geared toward a particular frequency. The acousto-optic deflector is a versatile device that provides precise and efficient control over the direction of a laser beam. Its ability to scan and steer laser beams in a specific direction makes it an essential tool in various applications such as microscopy, laser printing, and laser communication.

DESCRIPTION

Figure 1A:
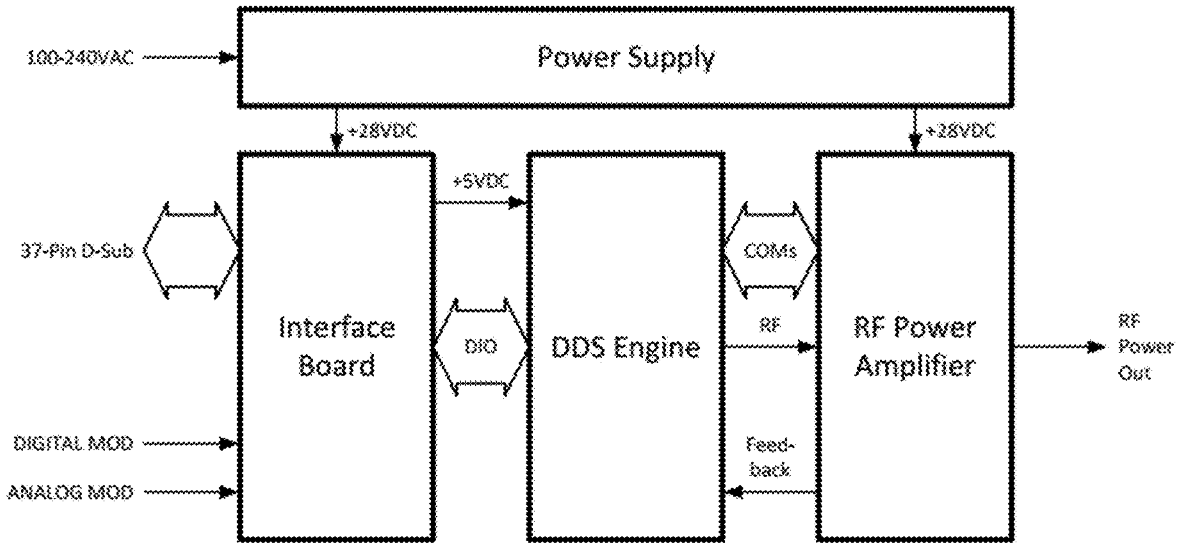
FIG. 1A-1H show details of an RF driver to drive an acousto-optic deflector.

FIG. 1A-1H show details of an RF controller to drive an acousto-optic deflector. The driver is flexible, capable of providing an RF output signal at frequencies up to 200 MHz and power levels up to 25 watts. As shown in FIG. 1A, the driver consists of various interconnected components and subsystems, including the power supply, interface board, DDS (Direct Digital Synthesizer) engine, and RF power amplifier.

In one embodiment, the power supply unit, depicted in FIG. 1A, is a Commercial Off the Shelf (COTS) module that takes a universal input line voltage (100-240 VAC, 50/60 Hz) and converts it to +28 VDC, 4.3 A, supplying power to the other components.

Figure 1B:
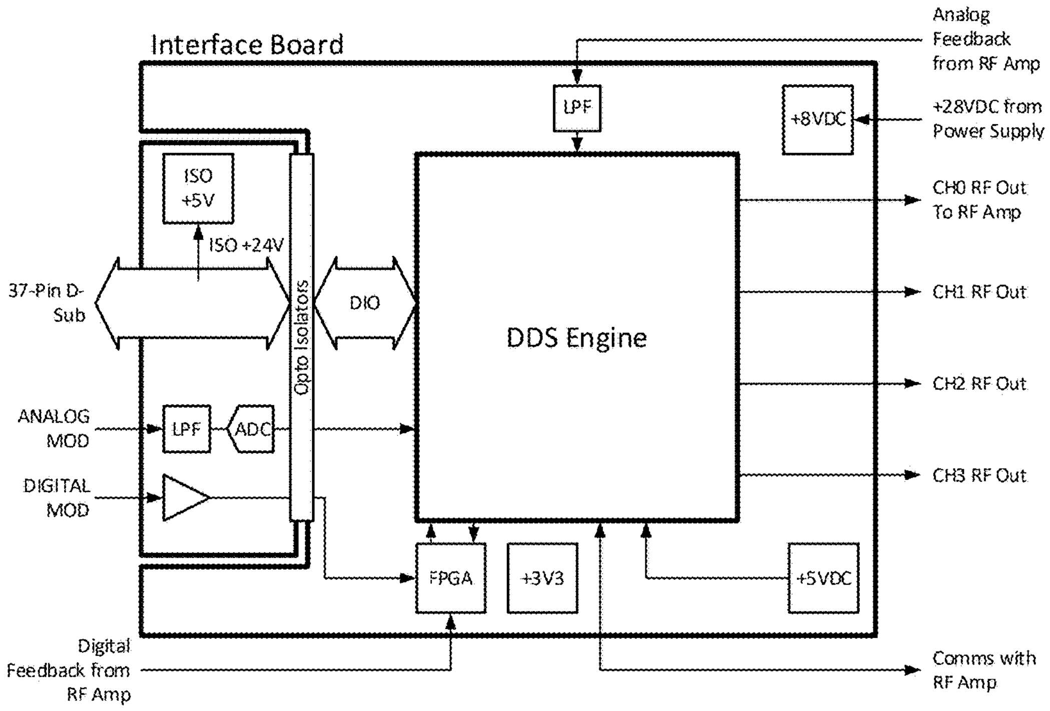

In one embodiment, the Interface Board, represented in FIG. 1B, allows customers to control the RF power level output of the RF driver. It incorporates various inputs and outputs, such as amplitude control, status output, system reset, digital modulation, and analog modulation. The board ensures galvanic isolation from the customer's equipment to prevent electrical noise interference, while also regulating the RF power output based on the settings provided.

In implementations, the interface board provides the customer a means to control the output RF power level of the GE-15261 RF driver. The Interface Board has a 10-bit amplitude control input (provided at the 37-pin D-sub connector), a status output and system reset input (at the same D-sub connector), a digital modulation input (DIGITAL MOD) and an analog modulation input (ANALOG MOD). These signals connect to the DDS Engine through a bank of opto-isolators, which provide a galvanically isolated interface from the customer's equipment. This helps minimize electrical noise from the customer's equipment from disrupting the function of the driver.

The 10-bit amplitude setting works with the signal applied to the DIGITAL MOD input. Maximum RF power is available from the driver when the 10-bit amplitude is set to 1023 (all bits set to logic '1') AND the signal at the DIGITAL MOD input is at a logic '1'. The RF drive level is fully off when the 10-bit amplitude is set to 0 OR when the DIGITAL MOD input is at a logic '0'. Alternatively, the ANALOG MOD input can be used with the DIGITAL MOD input. When a signal is applied to the ANALOG MOD input, it receives some signal condition through a Low-Pass Filter (LPF). This conditioned signal is digitized by the Analog-to-Digital Converter (ADC). The digitized signal then goes through the opto-isolator interface before being routed to the DDS Engine.

Figure 1C:
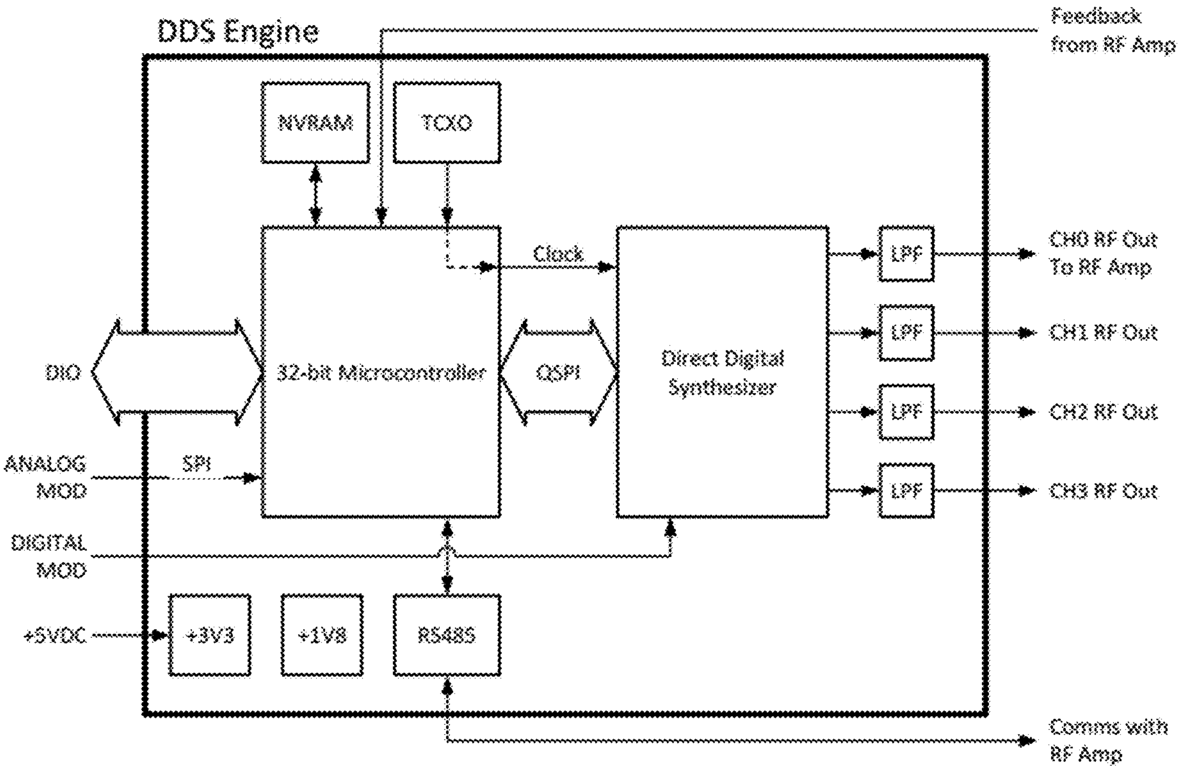

In one embodiment, the DDS Engine, illustrated in FIG. 1C, serves as the core signal synthesizer for the RF driver. It includes a 32-bit microcontroller, a Direct Digital Synthesizer, non-volatile memory, an RS485 interface, and a Temperature Compensated Crystal Oscillator. This engine generates and controls the four RF output signals, communicating with the RF power amplifier, and handling feedback mechanisms.

In implementations of the DDS engine, the engine synthesizes the RF signal that is sent to a power amplifier. The DDS Engine consists of a 32-bit microcontroller, a Direct Digital Synthesizer (DDS), non-volatile memory (NVRAM), an RS485 interface, and Temperature Compensated Crystal Oscillator (TCXO). The 32-bit microcontroller provides the intelligence of the system. It receives information from the DIO bus (connected to the interface board) to set the DDS channels for desired output amplitudes and frequencies; it provides status information out the same DIO bus; it reads and stores parameter information in the NVRAM; it communicates with the RF power amplifier via the RS485 interface; it and receives feedback from the RF power amplifier. The DDS is the means that creates the four RF output signals. Each channel is independently controlled by the microcontroller. The DDS upscales the reference clock created by the TCXO, which is routed through the microcontroller. This ensures proper communication synchronization between the DDS and the microcontroller. This upscaled reference clock allows the DDS to create the RF output signals. The DDS also allows the modulation of the RF signals. It can perform Amplitude Modulation (AM) based on the 10-bit amplitude input or the digitized amplitude provided by the Interface board.

The outputs of the DDS go through low-pass filters to remove unwanted artifacts and create spectrally pure sinewaves. The four channels are then routed back to the Interface board, which provide the means to supply them to other parts of the RF driver. The RS485 communication interface provides the DDS engine a means to know the system health of the RF power amplifier. Information such as forward RF power (power delivered to the AOD), reverse RF power (power reflected from the AOD), operating current, operating voltage, and internal operating temperature are provided. A status summary of these parameters is provided out the DIO port, which made available through the opto-isolators on the Interface Board to the 37-pin, D-sub connector.

A faster feedback path from the RF power amplifier is also provided. This path provides system redundancy to the RS485 communication interface. The microcontroller uses this feedback to immediately shut down the GE-15261 RF driver output if it determines that too much forward or reflected power is present at the AOD.

Figure 1D:
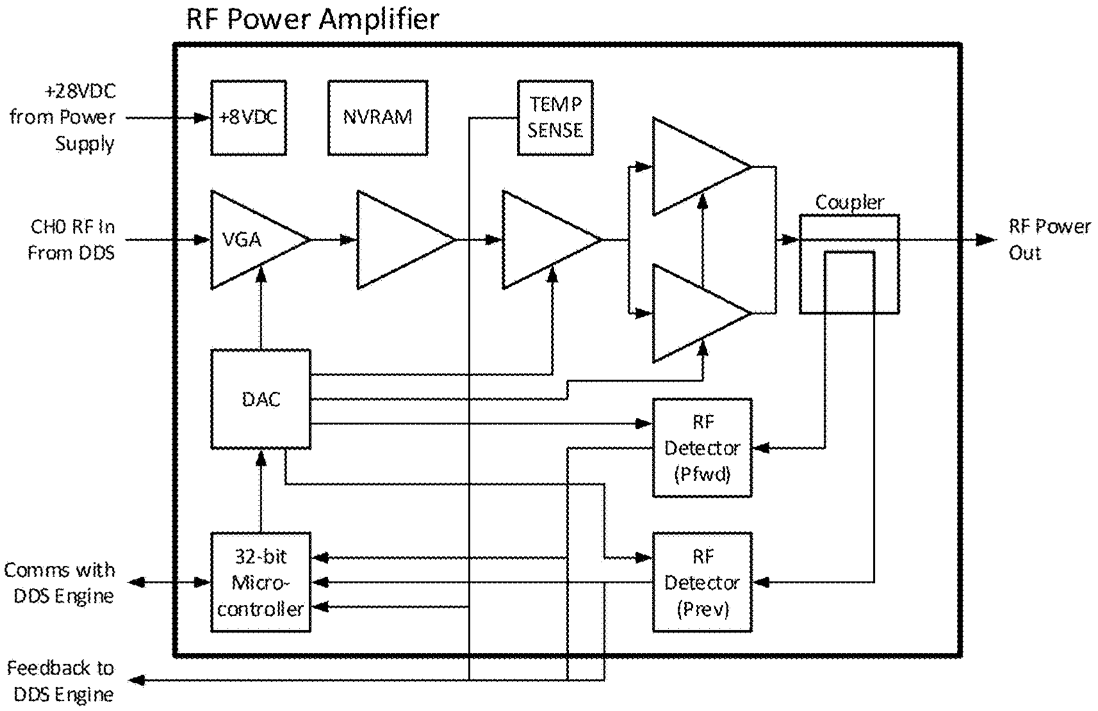

In one embodiment, the RF Power Amplifier, depicted in FIG. 1D, is a four-stage system responsible for amplifying the RF signal. It incorporates a Variable Gain Amplifier (VGA), a MMIC (Monolithic Microwave Integrated Circuit), large signal driver stage, and the final power output stage. The design includes safeguards such as bi-directional couplers, RF power detectors, and microcontroller-driven shut-down mechanisms, ensuring safe and efficient operation.

In one implementation, the RF power detection circuit measures forward and reflected power going to and coming from the AOD. The AOD is treated as a single-port device where the voltage and current waves emitted from the RF power amplifier are incident at the AOD input. If the AOD is not perfectly matched to the RF power amplifier, some of those incident voltage and current waves are reflected to the RF power amplifier.

Figure 1E:
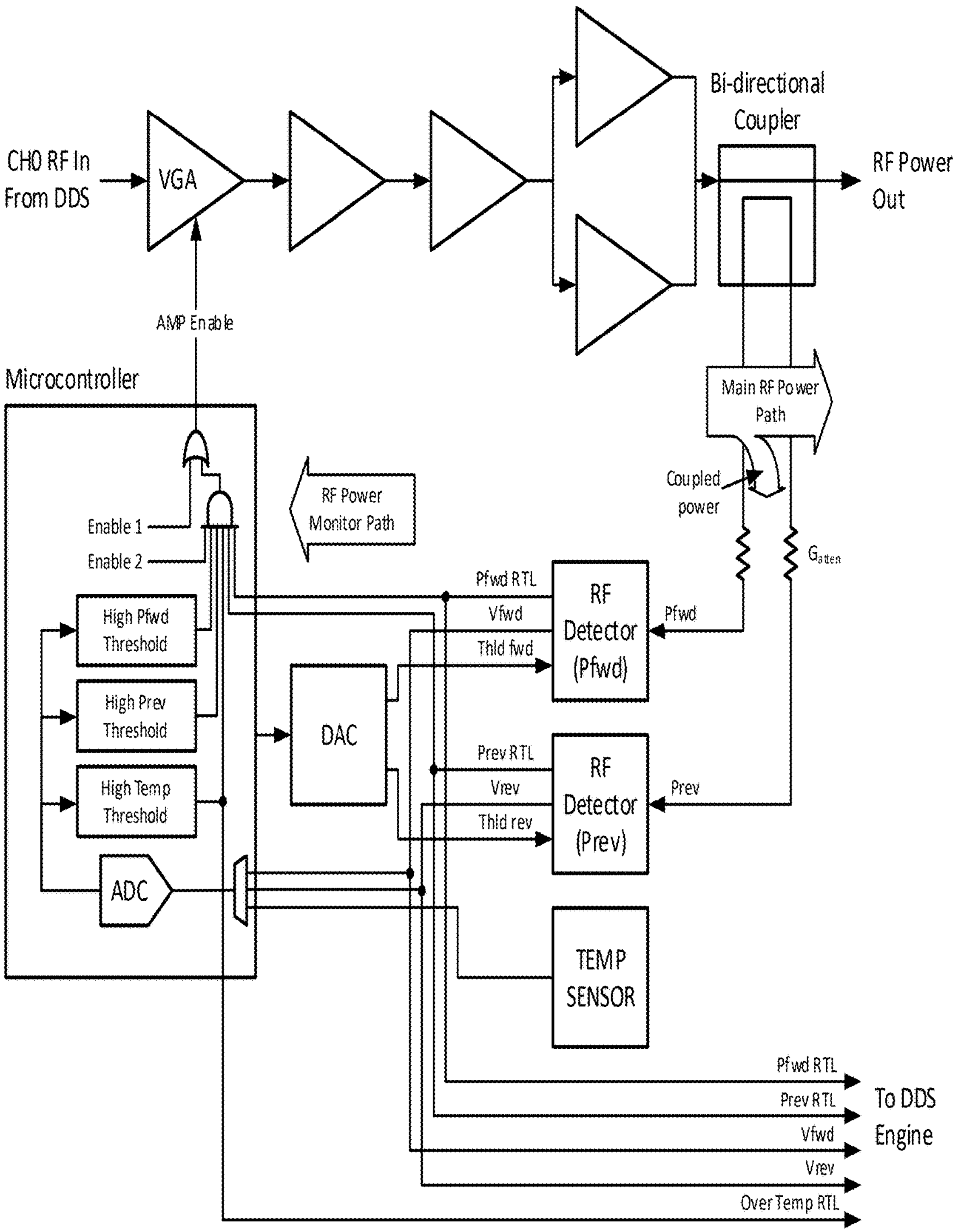

Next, as shown in FIG. 1E, the RF Power Measurement and Fault Detection (RF Power Amplifier) are detailed. The RF driver provides two means for RF power detection. The first means is a slower, more accurate measurement of the forward and reverse power. The second means is a faster, more coarse measurement. The first means provides the system with the capability to calibrate the RF power output and to shut down the driver when threshold limits are exceeded. The second means provides a faster shut down method to prevent catastrophic failure when threshold limits are exceeded. The figure below illustrates the operation of the RF power measurement and fault detection for the RF power amplifier.

As shown in FIG. 1E, CHO RF input generated by the DDS Engine goes through a four-stage RF power amplifier. The final stage of the RF power amplifier drives the bi-directional coupler. The bi-directional coupler has one main input, which accepts the RF power signal from the final amplifier stage, one main output, which provides this RF power signal to the AOD, one coupled power, which is reduced power representation of the forward RF power signal, and one isolated port, which is the reduced representation of the reflected RF power signal. The signals coming from the bi-directional coupler go through additional attenuation prior to the RF detectors, and are identified as $P_{fwd}$ and $P_{rev}$. The RF detectors convert the RF power levels to voltage RMS (Root Mean Square) equivalents, $V_{fwd}$ and $V_{rev}$, which are forward and reverse voltages, respectively. These voltages are digitized by the internal ADC of the microcontroller. The microcontroller uses these digitized voltage values to determine the forward and reverse power levels seen at the RF power output, and compare them to programmable fault threshold limits. The following equations determine the forward and reverse power levels:

| | |
|---|---|
| $P_{fwd} = V_{fwd}G_{fwd} + B_{fwd} + G_{atten} + G_{couple}$ | Error! No text of specified style in |
| $P_{rev} = V_{rev}G_{rev} + B_{rev} + G_{atten} + G_{couple}$ | Error! No text of specified style in |

Where:

$P_{fwd}$ and $P_{rev}$ are the forward and reflected power levels to and from the AOD, respectively.

$V_{fwd}$ and $V_{rev}$ are the voltages measured by the microcontroller ADC from the coupled and isolated ports of the bi-directional couple after fixed attenuation.

$G_{fwd}$ and $G_{rev}$ are the gain slopes to calculate $V_{fwd}$ and $V_{rev}$, respectively.

$B_{fwd}$ and $B_{rev}$ are the gain offsets to calculate for $V_{fwd}$ and $V_{rev}$, respectively.

$G_{atten}$ is the fixed attenuation before the RF detector devices.

$G_{couple}$ Is the coupling factor of the bi-directional coupler.

$P_{fwd}$ and $P_{rev}$ are used to verify the RF driver is operating properly and provide a means to shut down the driver if firmware limits are exceeded.

If the measured forward or reverse power levels exceed their programmed threshold limits, the microcontroller disables the VGA portion of the amplifier of the RF power amplifier.

The RF detector blocks enable a fast shut down means that operate congruently to the RF power measurements. Two DACs, programmed by the microcontroller, set a voltage threshold for the RF power detector circuits, $Thld_{fwd}$ and $Thld_{rev}$. When $V_{fwd}$ or $V_{rev}$ exceed their respective threshold value, the corresponding RF detector latches the fault and sends the fault flag to the microcontroller. $P_{fwd}$RLT is the forward power Real-Time Line fault flag; $P_{rev}$RLT is the reverse Real-Time Line fault flag. The microcontroller on the RF Power Amplifier board accepts these fault flags as interrupts. If either of these fault flags are set, they cause the microcontroller to deviate from its normal program execution. The microcontroller disables the VGA (first stage) of the RF power amplifier when it is executing the ISR (Interrupt Service Routine) for these fault flags. This allows the microcontroller to rapidly disable the VGA portion of the amplifier, which shuts off the RF power to the AOD in less than 500 ns (nano-seconds). This rapid shut down protects the RF power amplifier and the AOD from potential damage and permanent failure.

Normal operation is automatically restored by the microcontroller when it detects all fault conditions have been cleared. The microcontroller continually measures the forward and reverse power. When the forward and reverse power measurements are below their respective threshold limits, the microcontroller sends a reset pulse to the RF detectors to clear their latches (which clears the fault flags). When the microcontroller determines that $P_{fwd}$ and $P_{rev}$ are below their fault limits, $P_{fwd}$RLT and $P_{rev}$RLT are not set, and the microcontroller sets its firmware-controlled Enable 2 bit, the VGA stage of the RF amplifier is enabled and normal operation may resume. Note that the microcontroller has another firmware-controlled enable bit identified as Enable 1. This enable bit bypasses the fault shutdown logic to allow the RF power amplifier to be calibrated.

Figure 1F:
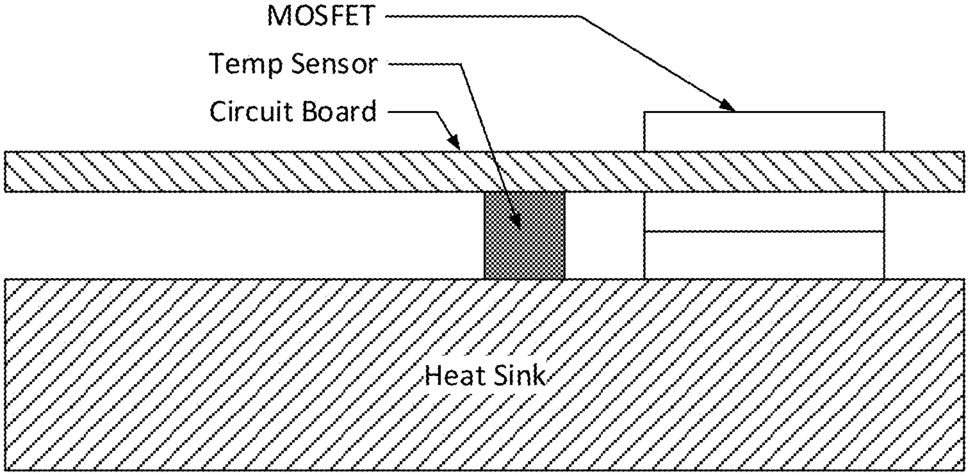

Temperature Measurement and Fault Detection (RF Power Amplifier) process is shown in FIG. 1F. The RF power amplifier has a temperature sensor located under the circuit board that contacts the heat sink and is local to the output MOSFET driver stage. This allows the sensor to rapidly detect temperature changes near the highest, heat generating component, which is the output MOSFET. The figure below illustrates the location of the temperature sensor proximity to the output MOSFET, as it is sandwiched between the printed circuit board and the heat sink. The temperature sensor provides a voltage output that changes linearly with temperature. This voltage is quantized by the internal ADC of the microcontroller. The microcontroller uses this quantized value to calculate the heat sink temperature. This calculated temperature is used to stabilize compensate the DC current of the two MOSFET stages and the RF power gain over the operating temperature range of the amplifier. The transfer function of the temperature sensor is defined as:

| | |
|---|---|
| $V_{temp} = T_A T_{coeff} + V_{0^\circ C.}$ | Error! No text of specified style in |

Where:

$V_{temp}$ is the temperature sensor output voltage.

$T_A$ is the ambient temperature.

$T_{coeff}$ is the sensor conversion coefficient.

$V_{0^\circ C.}$ is the offset voltage of the sensor at 0° C.

The heat sink temperature is determined by:

| | |
|---|---|
| $T_{HS} = V_{temp}G_{temp} + B_{offset}$ | Error! No text of specified style in |

Where:

$T_{HS}$ is the heat sink temperature.

$V_{temp}$ is the temperature sensor output voltage defined above.

$G_{temp}$ is the temperature measurement circuit gain.

$B_{offset}$ is the temperature measurement circuit offset.

The VGA control voltage is determined by:

$$V_{VGA} = T_{HS}G_{PA} + B_{PA}$$ Error! No text of specified style in

Where:

$V_{VGA}$ is the control voltage that sets the VGA gain.

$T_{HS}$ is the heat sink temperature defined above.

$G_{PA}$ is the temperature gain coefficient of the RF power amplifier as a function of temperature.

$B_{PA}$ is the control voltage offset at the lowest operating temperature of the RF power amplifier.

The gain of the VGA is:

$$G_{VGA}(\text{dB}) = V_{VGA}G_{coeff} + B_{offset}$$ Error! No text of specified style in Where:

$G_{VGA}$ (dB) is the gain of the VGA in decibels (dB).

$V_{VGA}$ is the control voltage that sets the VGA gain defined above.

$G_{coeff}$ is the VGA gain coefficient for the applied control voltage.

$G_{PA}$ is the temperature gain coefficient of the RF power amplifier as a function of temperature.

$B_{offset}$ is lowest gain of the VGA with zero control voltage.

Finally, the overall gain of the RF power amplifier is:

$$G_{PA}(\text{dB}) = G_{VGA} + G_{MMIC} + G_{Q1} + G_{Q2}$$ Error! No text of specified style in Where:

$G_{PA}$(dB) is the overall gain of the RF power amplifier.

$G_{VGA}$(dB) is the gain of the VGA defined above.

$G_{MMIC}$ is the fixed gain of the MMIC stage.

$G_{Q1}$ is gain of the first power MOSFET stage.

$G_{Q2}$. is the gain of the output power MOSFET stage.

NOTE: All the gain values are in decibels, which permits the summation of the individual gain stages.

The classical transfer function of the drain current of a MOSFET is $$I_{DS} = \beta(V_{GS} - V_{TH})^2$$ Error! No text of specified style in Where:

$I_{DS}$ is the drain-source (or simply just "drain") current flowing through the MOSFET.

β Is a gain coefficient based on the MOSFET geometry, electron surface mobility, etc.

$V_{GS}$ is the gate voltage applied to the MOSFET.

$V_{TH}$ is the voltage threshold of the MOSFET to overcome before it begins to conduct.

The drain current, $I_{DS}$, is temperature dependent. The gain of the MOSFET is a function of its drain current, and is also temperature dependent. The power output capability of the MOSFET is also set by the drain current. Using the heat sink temperature, $T_{HS}$, defined earlier helps stabilize the drain current, which will stabilize its gain and power output. The compensated drain current becomes:

$$I_{DS} = T_{HS}G_{comp} + \beta(V_{GS} - V_{TH})^2$$ Error! No text of specified style in Where:

$G_{comp}$ is the compensation gain needed to stabilize the drain current.

$I_{DS}$, $T_{HS}$, β, $V_{GS}$ and $V_{TH}$ are the previously defined terms.

FIG. 1F illustrates how the temp sensor is used to control the gain of the VGA stage and the drain currents of the MOSFET stages in the RF power amplifier. The microcontroller uses the calculated temperature value to detect if the heat sink temperature exceeds a programmed temperature limit. If the temperature exceeds the programmable over temperature threshold, the microcontroller disables the VGA section of the RF amplifier, which shuts off the RF amplifier. It will also set the fault flag, OVER TEMP RTL (Over Temperature Real-Time Line), which is sent to the DDS Engine via the Interface board.

Figure 1G:
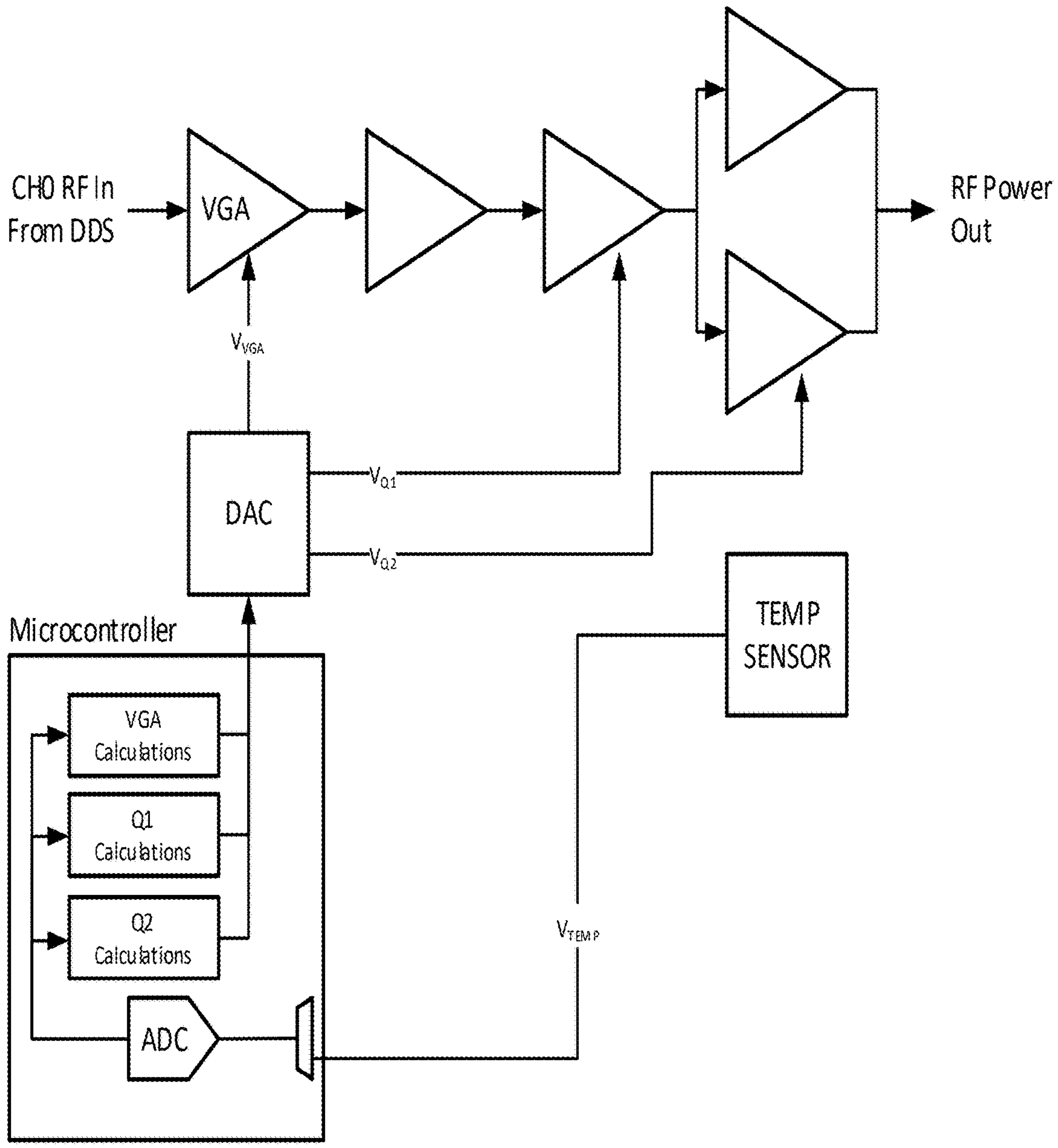

The RF Power and Temperature Fault Detection (Interface Board) circuit is detailed in FIG. 1G. The Interface board accepts the feedback from the RF Power Amplifier, entailing the RF detector voltages, $V_{fwd}$ and $V_{rev}$, the RF detector fault flags, $P_{fwd}$RLT and $P_{rev}$RLT, and the temperature sensor fault flag, OVER TEMP RTL. The fault flags are the digital feedback and are sent to the FPGA (Field Programmable Gate Array) for logic processing. The figure blow illustrates the interconnections of the signals as they flow through the Interface Board.

The fault flags are used by the FPGA to shut off the modulation signal from the DIGITAL MOD input. This provides sub 100 ns shut down of the RF power output to protect the driver and the AOD from permanent damage. The fault flags are also stored in a memory location in the FPGA for the DDS Engine to read. The DDS Engine reads the fault register in the FGPA over an I2C (also known as IIC for Inter-Integrated Circuit) bus to determine why the DDS output was forced to shut down.

The analog feedback signals from the RF amplifier ($V_{fwd}$ and $V_{rev}$) are filtered by the Interface Board prior to being passed on to the DDS Engine where they receive the same measurement processing done on the RF power amplifier.

Figure 1H:
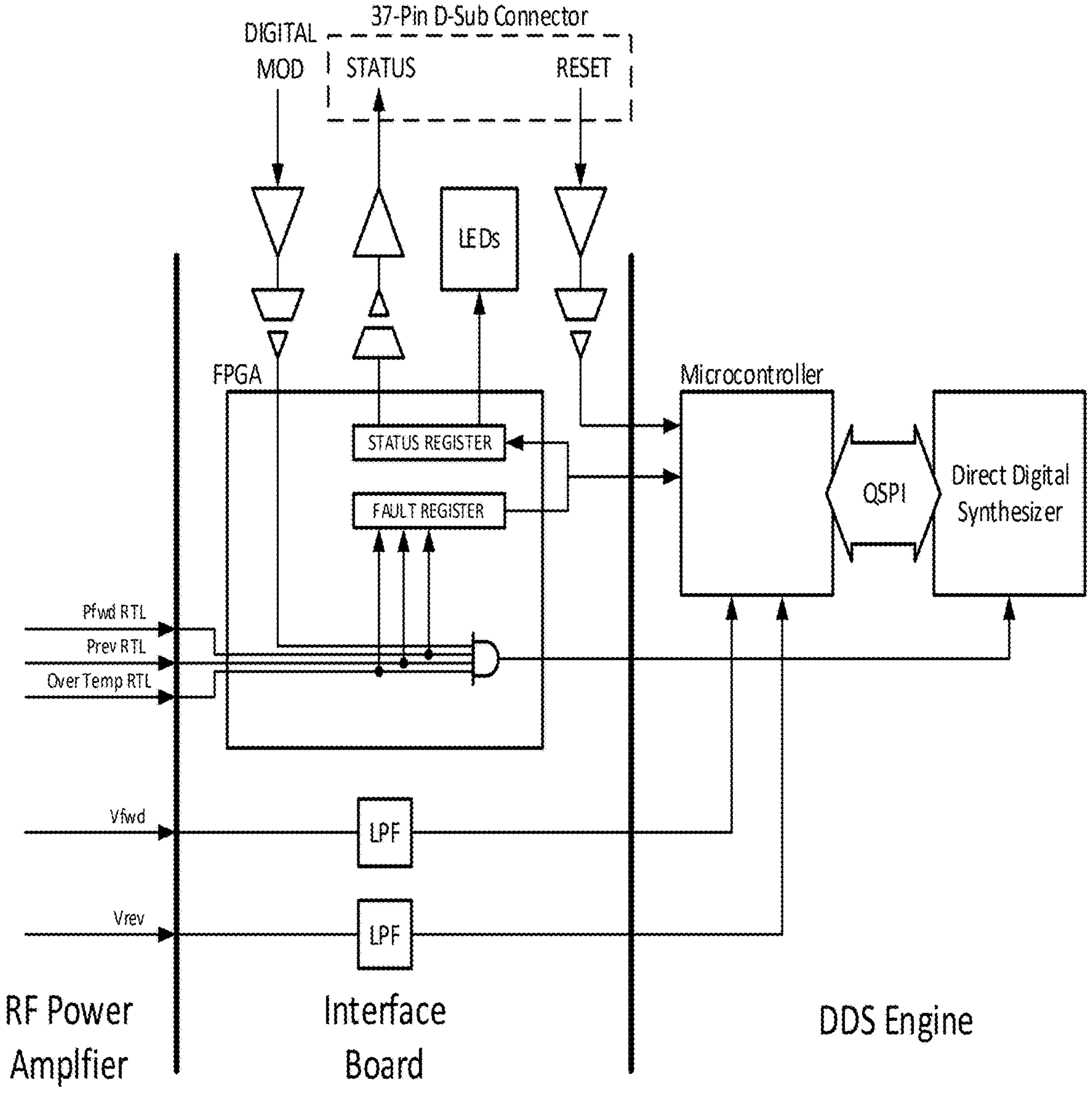

FIG. 1H shows in more details one implementation of the operation of the RF Power and Temperature Fault Detection (DDS Engine). As shown in FIG. 1H, the DDS Engine receives the digital and analog feedback from the RF power after passing through the Interface Board. The microcontroller on the DDS Engine polls the fault register in the FPGA on the Interface board several times per second. It accesses the register over the I2C bus connecting the two devices together.

The microcontroller is looking for the state of the $P_{fwd}$RLT, $P_{rev}$RLT, and OVER TEMP RTL bits. If a fault condition is detected, the microcontroller commands the DDS device to shut off the its output. The microcontroller sends a command to a register on the FPGA to illuminate status LEDs and clear the STATUS bit on the interface board.

The microcontroller on the DDS Engine also measures the analog feedback signals $V_{fwd}$ and $V_{rev}$ in the same manner as the RF Power amplifier does. If $V_{fwd}$ or $V_{rev}$ exceed programmed levels, the microcontroller on the DDS Engine will detect that as a fault condition and will process those fault conditions in the same manner as it does for the real-time line fault flags.

The DDS Engine continually polls the analog and digital feedback signals several times per second. If the fault conditions have cleared, the DDS Engine enables the DDS device. However, the DDS output will remain off until a reset signal is provided at the 37-pin D-sub connector on the Interface board, crosses through the optically isolated interface, and arrives at the DDS engine. Once that reset signal is detected, the DDS Engine will activate the DDS device output, clear the FPGA fault register, and set the LEDs to indicate a no-fault condition.

Overall, the interconnected subsystems work cohesively to provide a flexible and controlled RF power signal for AOD within a system such as a laser PCB drilling machine. The RF control system's control boards offer several significant advantages:

Adaptability and Customization: These control boards are adaptable to various customer machines, accommodating the unique and proprietary interfaces of different customers. They can be tailored to each customer's specific requirements and interface preferences, ensuring seamless integration with diverse equipment.

Standardized Core Functionality: Despite the individualized interfaces, the control boards maintain a standardized set of core functionalities. This includes the generation of an RF carrier signal, transmission to the accompanying RF power amplifier, provision for customer equipment to regulate the RF signal level, and offering status/diagnostic feedback to the customer's equipment. This standardization ensures a common baseline of functionalities across different interfaces, promoting ease of operation and comprehension for end-users.

Harmonization of Functionality: The core functionalities of the control boards are harmonized, allowing for consistency in performance and operation across different customer machines. While the specific interface might be unique for each customer, the underlying operations and functionalities are unified, simplifying the manufacturing process and reducing complexity in system integration.

Efficiency and Compatibility: The harmonized core functionalities make these control boards efficient and compatible with various machines, reducing the need for entirely distinct designs for different customers. This efficiency not only streamlines the manufacturing process but also facilitates maintenance and support as the fundamental operations remain consistent.

Streamlined Development and Support: By maintaining a standard set of core functions, development efforts and ongoing support can be streamlined. Engineers can focus on the universal functionalities common to all control boards, thereby reducing development time and complexity in creating and maintaining these systems.

Enhanced User Experience: The standardized core functions ensure a consistent and familiar user experience despite the variation in interface designs. Users can expect similar functionalities and features, which contributes to ease of operation and understanding, irrespective of the specific machine's interface.

Overall, the control boards' ability to harmonize core functionalities while accommodating unique interfaces offers a balance between customization and standardization, providing flexibility and ease of integration for diverse customer requirements.

Figure 2A:
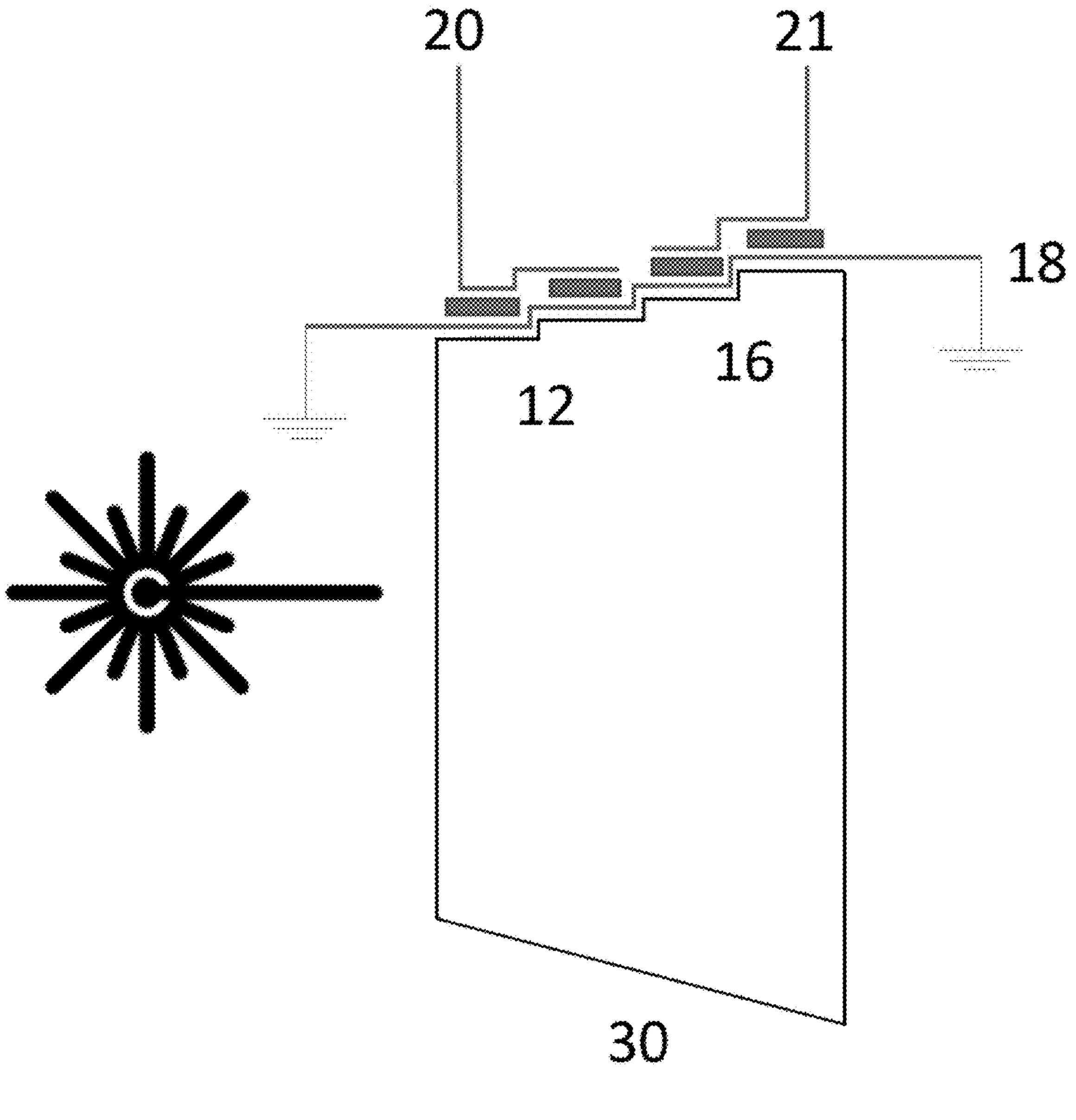
FIG. 2A-2B show an exemplary phased array opto-acoustic deflector.

FIG. 2A shows an exemplary phased array opto-acoustic system. In a phased array opto-acoustic system, a pulsed laser beam is used to generate acoustic waves in a sample chamber such as optical element that receives the laser beam. The laser beam path is altered by the sound generated by the opto-acoustic elements in a transducer coupled to the optical element.

FIG. 2A-1B show a device 10 having stepped surfaces 12 and 16 on one end, and an angled end 30 opposite to the stepped surfaces 12 and 16. Turning now to FIG. 2A, an exemplary phase-array device includes an optical element having a surface with one or more steps formed thereon, where the optical element has at least two step heights. The different heights of the steps affect the acousto-optic RF frequency responses.

Transducers are mounted above the stepped surfaces 12 and 16, with one side of each transducer coupled to RF inputs 20-21 respectively, and the other side of the transducer connected to ground 18. The phased array transducer array has a plurality of transducers mounted on a top surface, with each transducer at a different height. Each transducer in the array is positioned at different vertical positions, such as at different heights above a sample chamber surface. One example of such an array is a linear transducer array, in which a linear array of transducers is arranged along a surface, with each transducer positioned at a different height. Another example is a 2D transducer array, in which a grid of transducers is positioned at different heights to form a 2D array.

Figure 3A:
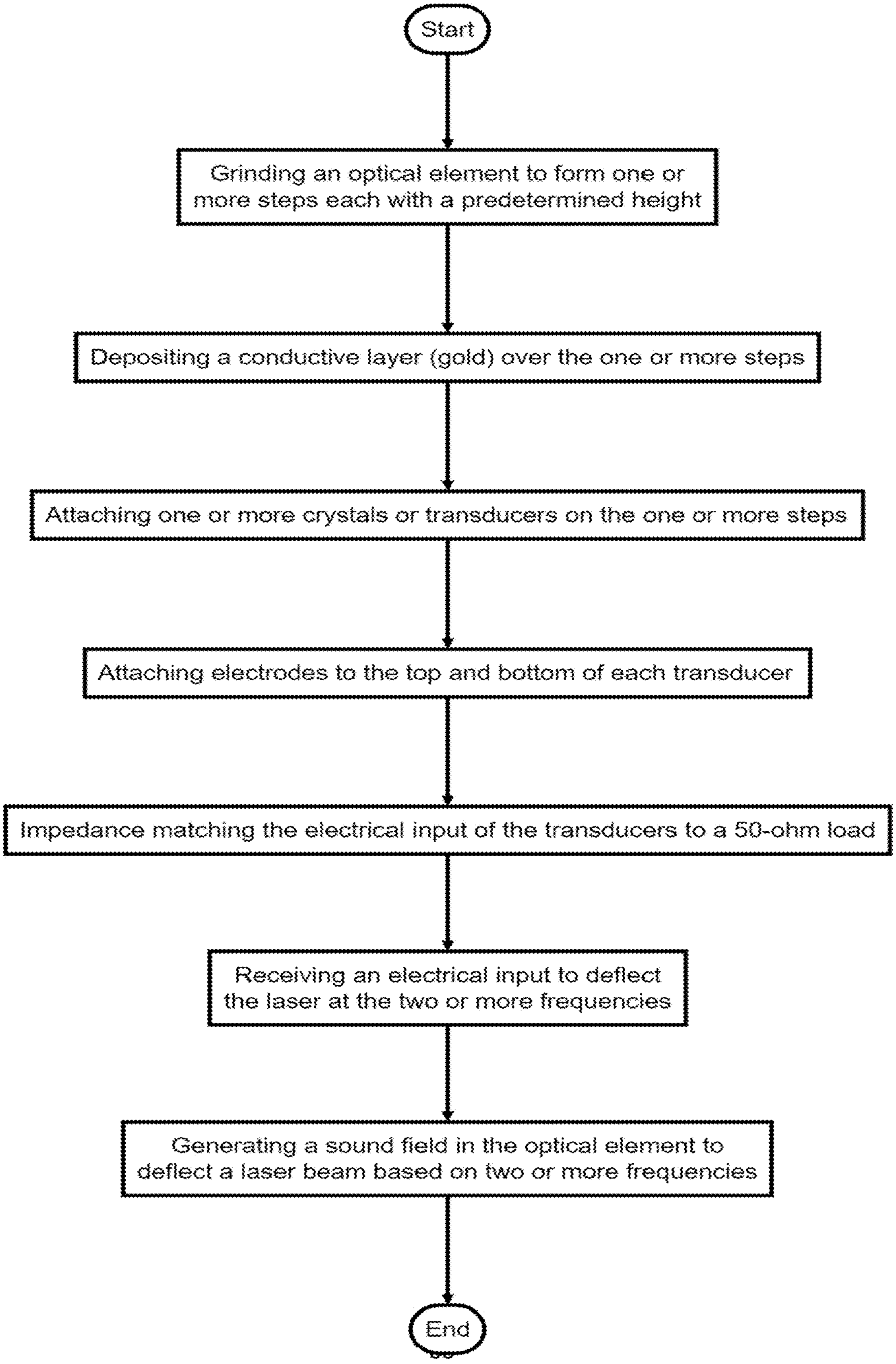
FIG. 3A-3B show exemplary processes for forming and using the deflector of FIG. 2A.
Figure 3B:
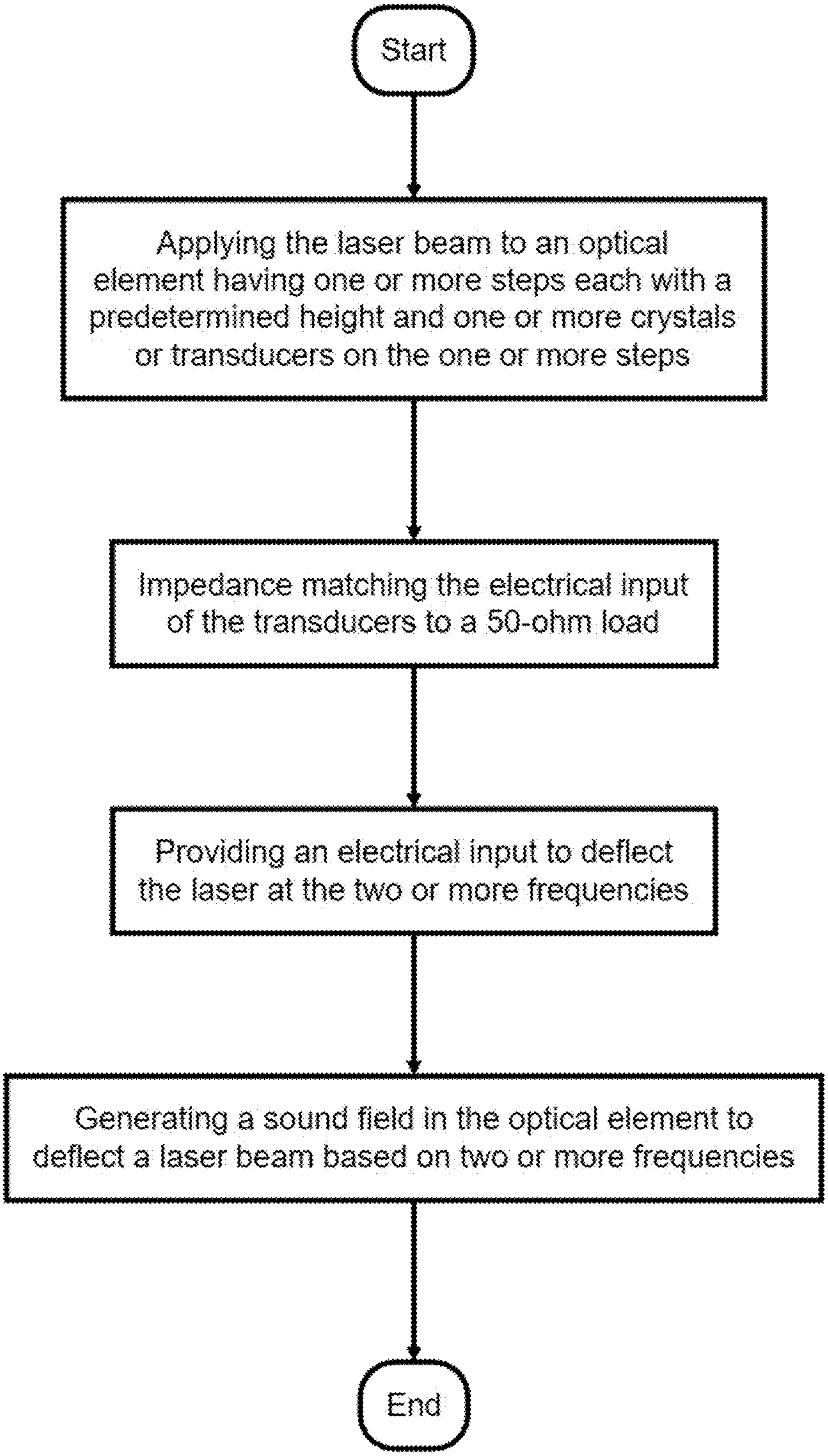

As shown in FIG. 3B, the optical element 10 has a surface with one or more steps 12 formed thereon, where the height of each step on the surface of the optical element can be precisely controlled during the manufacturing process, which allows for the creation of specific acousto-optic frequency responses. The step height can be chosen to match the wavelength of RF input, creating a specific phase shift, or to provide a specific diffraction angle. The height of each step can also affect the coupling between the acoustic wave and the optical wave, which determines the efficiency and bandwidth of the acousto-optic interaction. Grinding or subtractive techniques can be applied to the surface of the optical element to form one or more steps spaced apart on the surface, where the height of each step affects the acousto-optic RF frequency response. This provides a versatile and precise tool for manipulating the interaction between acoustic waves and optical waves. This technology is useful in a variety of applications, such as laser beam modulation, scanning, and frequency shifting.

In some cases, the steps 12 on the surface of the optical element can have a plurality of different heights. This can be done to create a more complex RF frequency response, which can be useful for certain applications. Transducer 13 is adhesively bonded with a thin epoxy layer 15 to the top to steps 12. This is done when the device 10 is inserted into its spot in the receptacle of FIG. 5C, applying a thin layer of epoxy 15 on top of step 13, and then by operation of vacuuming the transducer 13 to secure it to the bottom of the piston and by air pressure lowering the piston with the top of step 12 and evenly apply the epoxy to secure the transducer 13 to device 10.

By having steps with different heights, the acousto-optic device can be designed to deflect light at multiple angles or frequencies. This can be used, for example, in laser scanning systems, where the deflection angle of the incident laser beam needs to be precisely controlled.

The optical and acoustic elements in a phased array opto-acoustic device are arranged in a specific pattern to allow for precise control of the acoustic waves generated and detected. The optical elements transmit the laser beam through the sample chamber. The acoustic elements may include a phased array of transducers, which are used to control the direction and intensity of the acoustic waves.

In these applications, the optical element is made of a material that can support a propagating acoustic wave, such as a crystal or glass. The acoustic wave is created by a transducer, and its frequency is modulated by an applied RF signal. The optical element is made of a material that can support a propagating acoustic wave, such as a crystal or glass. The acoustic wave is created by a transducer, and its frequency is modulated by an applied RF signal. the height of each step affects the acousto-optic RF frequency response, is typically used in acousto-optic modulators and deflectors. One embodiment of the instant device enables a single device to work at two distinct frequencies, enabling one device to be used instead of two separate devices.

The optical element has a surface with one or more steps formed thereon, where the height of each step on the surface of the optical element can be precisely controlled during the manufacturing process, which allows for the creation of specific acousto-optic frequency responses. The step height can be chosen to match the wavelength of the incident light, creating a specific phase shift, or to provide a specific diffraction angle. The height of each step can also affect the coupling between the acoustic wave and the optical wave, which determines the efficiency and bandwidth of the acousto-optic interaction.

Grinding or subtractive techniques can be applied to the surface of the optical element to form one or more steps spaced apart on the surface, where the height of each step affects the acousto-optic RF frequency response. This provides a versatile and precise tool for manipulating the interaction between acoustic waves and optical waves. This technology is useful in a variety of applications, such as laser beam modulation, scanning, and frequency shifting.

In some cases, the steps on the surface of the optical element can have a plurality of different heights. This can be done to create a more complex RF frequency response, which can be useful for certain applications.

By having steps with different heights, the acousto-optic device can be designed to deflect light at multiple angles or frequencies. This can be used, for example, in laser scanning systems, where the deflection angle of the incident laser beam needs to be precisely controlled.

FIG. 3A shows an exemplary process to form a phased-array transducer. The process includes the following operations:

- grinding an optical element to form two or more steps each with a predetermined height;
- depositing a conductive layer over the one or more steps;
- attaching one or more crystals or transducers on the one or more steps; and
- attaching electrodes to the top and bottom of each transducer.

In more details, the process of creating steps with different heights on the surface of an optical element can be done using various techniques, including etching or grinding. Etching can be used to selectively remove material from the surface, while grinding can be used to selectively remove material from certain areas of the surface. The end result is a surface with steps of varying heights that can be used to control the RF frequency response of the acousto-optic device.

The tools used to grind the optical element with the steps may vary depending on the material of the optical element and the desired precision of the steps. Some common tools used for grinding optical elements include diamond-tipped tools, abrasive wheels, and lapping/polishing pads.

Diamond-tipped tools are often used for grinding hard and brittle materials such as glass and some ceramics. These tools are made of a thin metal shank with a small diamond grit on the tip. The diamond grit is used to scratch away material from the optical element, creating the desired steps. Diamond-tipped tools can achieve high precision and smooth surface finishes.

Abrasive wheels are another common tool used for grinding optical elements. These wheels are made of abrasive particles bonded to a wheel shape. The abrasive particles can be made of materials such as silicon carbide or aluminum oxide, and the bond can be made of materials such as resin or vitrified ceramic. Abrasive wheels are often used for grinding softer materials such as plastic or some metals. These wheels can remove material quickly but may not achieve the same precision as diamond-tipped tools.

Lapping and polishing pads are used for finishing the optical element after grinding. These pads are made of a soft material such as felt or polyurethane foam and are coated with a fine abrasive material such as diamond paste. The optical element is placed on the pad and moved in a circular motion to achieve a smooth surface finish.

Other tools that may be used for grinding optical elements include grinding machines, CNC equipment, and ultrasonic machining tools. The choice of tool depends on the material of the optical element, the desired precision, and the production volume.

Cleaning of the optical element surface is an essential step to ensure the adhesion of the subsequent gold layer. The cleaning operation typically involves the following steps:

- Rinse the optical element with deionized water or a cleaning solvent to remove any loose particles or debris on the surface.
- Immerse the optical element in a mild acid solution, such as hydrochloric acid or sulfuric acid, to remove any organic or inorganic contaminants. The duration of the immersion depends on the type and level of contamination and typically ranges from a few seconds to several minutes.
- Rinse the optical element with deionized water to remove any residual acid and neutralize the surface.
- Dry the optical element using a stream of dry nitrogen or argon gas or a cleanroom-compatible drying method such as spin-drying or vacuum-drying.
- Inspect the optical element surface under a microscope or with a cleanroom-compatible surface analysis tool to ensure that the surface is free of particles, scratches, or defects that can affect the performance of the subsequent gold layer deposition.

By following these steps, the optical element surface can be prepared for the deposition of a uniform and adherent gold layer.

The height of each step on the surface of the optical element can be precisely controlled during the manufacturing process, which allows for the creation of specific acousto-optic frequency responses. The step height can be chosen to match the wavelength of the incident sound, creating a specific phase shift, or to provide a specific diffraction angle. The height of each step can also affect the coupling between the acoustic wave and the optical wave, which determines the efficiency and bandwidth of the acousto-optic interaction.

In an acousto-optic modulator, the applied RF signal modulates the frequency of the acoustic wave, which in turn modulates the phase or amplitude of the optical wave passing through the optical element. The modulation depth and frequency bandwidth of the modulator depend on the height and spacing of the steps on the optical element. The applied RF signal generates an acoustic wave that travels along the surface of the optical element, causing the incident optical beam to diffract at a specific angle. The applied RF signal modulates the frequency of the acoustic wave, which in turn modulates the phase or amplitude of the optical wave passing through the optical element.

A conductive layer is formed on the surface with the steps. In some cases, a conductive layer such as gold is deposited on the surface with the steps. This is done to allow for an electrical contact to be made with the surface, which is necessary for applying the RF signal to the acousto-optic device. The conductive layer also helps to reduce any unwanted reflections that may occur at the surface, which can affect the performance of the device.

First, a layer of nichrome is formed on the surface of the optical element since gold does not bond well with the optical element. Then a layer of gold is deposited above the nichrome layer. The conductive layer is typically deposited using a process called physical vapor deposition (PVD) or sputtering. In PVD, a thin film of gold is deposited on the surface by evaporating the metal in a vacuum chamber and allowing it to condense onto the surface. In sputtering, a plasma is used to eject gold atoms from a target material and deposit them onto the surface.

The equipment used to deposit a fine layer of gold over the steps on the optical element is called a physical vapor deposition (PVD) system. PVD is a process where a solid material is vaporized in a vacuum environment, and the resulting vapor condenses onto a substrate to form a thin film.

In this case, the gold is evaporated in a vacuum chamber using an electron beam gun or a resistive filament. The vaporized gold atoms travel in a straight line towards the substrate, where they condense and form a thin layer on the surface of the optical element. The thickness of the gold layer can be controlled by adjusting the deposition rate and the deposition time.

The PVD system typically includes a vacuum chamber, a substrate holder, a source of gold, and a means to evaporate the gold. The substrate holder is designed to hold the optical element with the steps facing upwards and is positioned in the vacuum chamber. The chamber is then evacuated to a high vacuum level, typically in the range of 10^-6 to 10^-7 torr, to prevent contamination of the gold layer.

The gold source is typically a solid piece of gold that is heated by an electron beam or a resistive filament. As the gold is heated, it evaporates and condenses on the surface of the optical element. The deposition rate and deposition time can be controlled by adjusting the power of the heating source and the distance between the source and the substrate.

Once the gold layer is deposited, the optical element is removed from the vacuum chamber and inspected for uniformity and thickness. The thickness of the gold layer is typically in the range of a few hundred nanometers to a few microns, depending on the application.

Overall, the PVD system is a precise and reliable method for depositing a thin layer of gold on the surface of the optical element with the steps, ensuring optimal performance of the acousto-optic deflector.

A transducer or a crystal is then affixed to each step, preferably at different heights based on the height of the steps. The crystal is secured to each step of an optical element using epoxy bonding in one embodiment. The crystal is placed in contact with the conductive layer on the surface of the optical element. Electrodes positioned on each surface of each crystal, one connected to ground and one connected to an RF signal driving the crystal.

After the conductive layer is deposited and the crystal affixed to the optical element, electrical contacts are typically made to the surface using wire bonding or other techniques. Electrodes are then connected to each side of the crystal. Energy applied to the crystal generates an acoustic wave in response to an applied RF signal, and the electrodes are used to apply the RF signal to the crystal. An RF signal is then applied to the contacts, which generates the acoustic wave that modulates the refractive index of the acousto-optic material and deflects the incident light.

The electrodes are made of a conductive material, such as gold or aluminum, and are placed on opposite sides of the crystal. When an RF signal is applied to the electrodes, it generates an acoustic wave in the crystal, which can then be used to modulate the laser beam applied to the optical element.

An RF signal applied to the crystal would generate an acoustic wave, which would propagate through the crystal and into the optical element. The acoustic wave would then modulate the refractive index of the optical element, causing it to diffract or deflect an incident beam of light.

The positioning and design of the electrodes can be critical to the performance of the acousto-optic device. The spacing between the electrodes, the shape of the electrodes, and the applied voltage all affect the frequency response of the device.

FIG. 3B shows an exemplary method to deflect a laser beam that includes:

- applying the laser beam to an optical element having one or more steps each with a predetermined height and one or more crystals or transducers on the one or more steps;
- impedance matching the electrical input of the transducers to a 50-ohm load;
- providing an electrical input to deflect the laser at the two or more frequencies; and
- generating a sound field in the optical element to deflect a laser beam based on two or more frequencies.

Other methods to form an opto-acoustic deflector include:

- grinding an optical element to provide one or more steps each with a predetermined height;
- depositing a layer of gold over the one or more steps; and
- attaching one or more crystals or transducers on the one or more steps.

Figure 4:
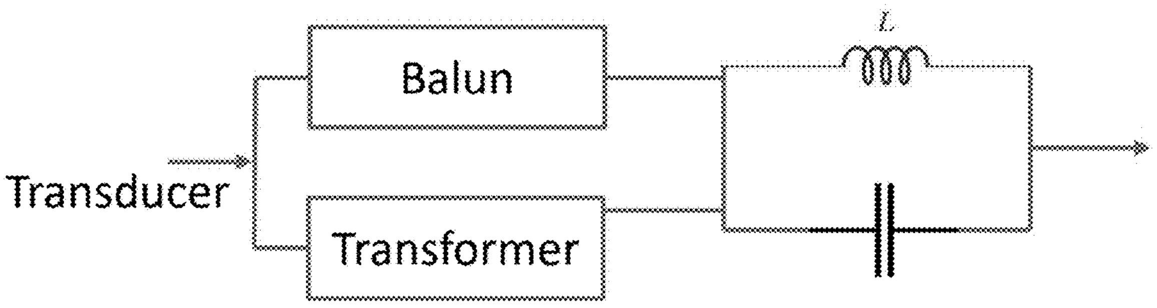
FIG. 4 shows an exemplary tuning element that is coupled to the electrodes to match a predetermined impedance.

FIG. 4 shows an exemplary tuning element that is coupled to the electrodes to match a predetermined impedance. The tuning element is used to match the predetermined impedance of the acousto-optic phased array transducers. The tuning element is typically an inductor with a predetermined coil length and a variable capacitor or a trimmer capacitor that is adjusted to match the impedance of the system. This is important to ensure maximum power transfer between the amplifier and the acousto-optic deflector, which leads to better performance and efficiency. The tuning element can be adjusted by a technician or can be automated using a feedback control loop to continuously monitor and adjust the impedance.

The tuning element is typically used to match the impedance of the acousto-optic deflector to the impedance of the driving circuit, which is often 50 ohms. This ensures maximum power transfer between the amplifier and the acousto-optic deflector. The impedance matching can help to minimize the reflection of the signal, which can cause unwanted interference and signal degradation.

The tuning element can be used to match the impedance of the acousto-optic deflector at specific RF frequencies to a 50-ohm impedance. This is typically done using a matching network or filter, which can be adjusted to achieve the desired impedance match. For example, if the deflector has an output impedance of 40 MHz and 60 MHZ, a tuning element can be designed to match those frequencies to 50 ohms.

The tuning element can be implemented using various techniques, such as a lumped element filter, a distributed element filter, or a combination of both. The choice of technique depends on various factors such as the frequency range, the required bandwidth, and the physical size of the tuning element.

Once the tuning element is designed, it can be coupled to the electrodes of the acousto-optic deflector to achieve the desired impedance match. This can be done using various coupling techniques such as wire bonding or soldering. The impedance match ensures that maximum power is transferred from the RF amplifier to the acousto-optic deflector, which improves its efficiency and performance.

Opposite to the surface with the steps on the optical element is a slanted end with a compound angle to direct any reflected sound field away from the laser beam working range. This can help to reduce unwanted interference and improve the overall performance of the acousto-optic deflector. The compound angle can be designed to achieve the desired deflection angle for the laser beam while also minimizing any unwanted reflections or diffraction effects. The exact design of the slanted end will depend on the specific application and requirements of the acousto-optic deflector.

To prevent these issues, it is important to carefully control the deposition process and ensure that the gold layer is well adhered to the optical element's surface. Additionally, the amount of epoxy used should be carefully controlled and optimized to ensure strong bonding between the crystals and the surface without creating unnecessary attenuation of the acoustic waves. Quality control and testing should also be performed to ensure that the opto-acoustic deflector meets the required specifications for performance and reliability.

To form a slanted end of the optical element with a 30 degree angle measured from a long side to a short side and a surface with a 2 degree slope, the following steps can be taken:

- Obtain an optical element made of the desired material, such as germanium or tellurium dioxide (TeO2).
- Determine the dimensions of the optical element and mark the area where the slanted end will be located.
- Use a precision saw or cutting tool to cut the slanted end at the desired angle. This can be done by tilting the cutting tool at a 30 degree angle relative to the long side of the optical element.
- Use a precision grinding tool, such as a diamond or abrasive wheel, to grind the surface of the slanted end to achieve the desired 2 degree slope. This can be done by adjusting the angle and pressure of the grinding tool.
- Inspect the surface of the slanted end to ensure that it is smooth and free of any cracks or defects.
- Clean the surface of the slanted end using a gentle solvent, such as isopropyl alcohol, to remove any debris or particles.
- Optionally, apply a protective coating, such as a thin layer of anti-reflection coating or a metal film, to the surface of the slanted end to improve its optical properties and prevent damage from handling or exposure to the environment.

Overall, the key to forming a slanted end with the desired angle and slope is to use precision tools and techniques to achieve the desired shape and surface quality, while minimizing any damage or stress to the optical element.

The optical element can be germanium, tellurium dioxide (TeO2), lithium niobate, PZT, fused silica, chalcogenide glasses, glass. The choice of material for the optical element depends on various factors such as the desired optical properties, thermal and mechanical stability, and the specific application for which the element will be used.

The choice of crystal for an opto-acoustic laser system depends on the specific application and the properties of the crystal. Some of the factors that are typically considered when selecting a crystal for opto-acoustic applications include the crystal's acoustic and optical properties, as well as its thermal and mechanical stability, among others. One commonly used crystal for opto-acoustic applications is lithium niobate (LiNbO3). LiNbO3 has excellent acoustic properties, with a high acoustic velocity and a low acoustic attenuation, which makes it ideal for generating and detecting acoustic waves. It also has strong nonlinear optical properties, which can be used for frequency conversion and modulation of the laser beam.

Another crystal that is commonly used for opto-acoustic applications is quartz (SiO2). Quartz has a high acoustic velocity and a low acoustic attenuation, making it ideal for acoustic wave generation and detection. It is also highly transparent in the infrared region, which is useful for many laser applications.

Other crystals that are sometimes used for opto-acoustic applications include gallium arsenide (GaAs), gallium nitride (GaN), and sapphire (Al2O3). These crystals have specific properties that make them suitable for certain applications, such as high-temperature stability or high optical nonlinearity.

The choice of crystal for an opto-acoustic laser system depends on the specific requirements of the application, such as the desired acoustic and optical properties, as well as the thermal and mechanical stability of the crystal.

Some commonly used materials for acousto-optic devices include:

- Germanium: Germanium is a common material for acousto-optic modulators operating in the mid-infrared region due to its high refractive index and low absorption coefficient in this range.
- Tellurium dioxide (TeO2): TeO2 is a widely used material for acousto-optic devices due to its high electro-optic coefficient and wide transparency range from UV to mid-infrared.
- Lithium niobate (LiNbO3): LiNbO3 is a well-known electro-optic material with high electro-optic coefficients, making it a popular choice for high-speed acousto-optic modulators and deflectors.
- PZT: PZT or lead zirconate titanate is a piezoelectric material with high coupling coefficients, making it an ideal choice for transducers in acousto-optic devices.
- Fused silica: Fused silica has a high laser damage threshold and low coefficient of thermal expansion, making it suitable for high-power applications.
- Chalcogenide glasses: These are glasses containing elements from the chalcogen group such as sulfur, selenium, and tellurium. They have high refractive indices, wide transparency ranges, and are suitable for acousto-optic devices in the mid-infrared range.
- Glass: Different types of glasses can be used for acousto-optic devices depending on the specific application and desired properties. For example, borosilicate glass is commonly used for high-power applications, while crown glass is used for its high refractive index.

Next, a description of the process to form an opto-acoustic deflector is detailed. The operation includes the following:

Grinding the Optical Element: The first step is to grind the optical element to provide one or more steps, each with a predetermined height. This step involves precise grinding to create the desired step heights for optimal acousto-optic performance.

Deposition of Conductive Layer: After grinding, a layer of gold is deposited over the one or more steps of the optical element. To improve bonding of the gold to the optical layer, a layer of nichrome is first deposited on the optical element, and the gold conductive layer is subsequently formed. The gold layer provides a conductive surface that can be used for attachment of the crystals or transducers.

Attachment of Crystals or Transducers: One or more crystals or transducers are attached on the one or more steps of the optical element. These crystals or transducers generate acoustic waves that interact with light passing through the optical element and deflect it in a controlled manner. The attachment process can involve a variety of techniques, such as epoxy bonding, soldering, or mechanical clamping.

Capturing Electrical Output: Electrical signals are generated by the crystals or transducers when they are subjected to acoustic waves. These electrical signals are captured using specialized electronics designed to amplify and process them for further analysis.

Impedance Matching: The final step is to impedance match the electrical output to a 50-ohm load. This involves the use of a tuning element such as a matching network or a transformer, which helps to adjust the impedance of the electrical signal to match the required load. This step is critical to ensure maximum power transfer and minimum signal loss.

Once the impedance matching is complete, the opto-acoustic deflector is ready for use. It can be integrated into various optical systems to deflect and control light with high precision, making it useful for a variety of applications such as laser printing, holography, and optical communication.

In the context of a transducer array with each transducer at a different height, it is possible to achieve the height difference by grinding the surface on which the transducers are mounted to create a stepped profile. This can be accomplished using precision grinding tools and techniques, such as diamond grinding or abrasive blasting.

The grinding process involves removing material from the surface in a controlled manner to create a series of steps or terraces with different heights. The transducers can then be mounted on the surface at the desired heights, with each transducer positioned on a different terrace. The height difference between the transducers can be controlled by adjusting the height and spacing of the terraces during the grinding process.

Grinding can be a precise and effective method for creating a stepped surface with controlled heights for a transducer array. The result of the grinding process forms a set of pedestals to mount transducers to the pedestal array, with at least two transducers with different heights.

Attaching a transducer to a surface of the steps can be done using an epoxy spread in an even and thin manner. This method involves applying a layer of epoxy or other adhesive material to the surface and then placing the transducer on top of the adhesive. The epoxy is then allowed to cure, creating a strong and permanent bond between the transducer and the surface.

As each transducer may be positioned at a different height, an array of spreaders can be used to apply the epoxy to the surface in a controlled and uniform manner. Each application head can be customized according to the desired height, allowing the epoxy to be applied to specific areas of the surface to create the desired stepped profile. The use of an array of spreaders, each with self adjustable heights, can provide a high degree of control and precision in the placement of the transducers, allowing for a more uniform and consistent array. However, specialized equipment is needed to create and operate the array of individually pliant spreaders so that each spreader automatically conforms to the different step heights.

The array of individually pliant spreaders can be pneumatically actuated to allow for precise control over the height of each transducer in the array. Pneumatic actuation involves using compressed air to control the movement of the spreaders and to stop them at the desired height for each surface portion.

By using pneumatic actuation with the pliant or conformal heads, the spreaders can be controlled to stop at the exact height required for each transducer, allowing for an even spread of the epoxy and a precise positioning of the bonding pressure on the transducers to ensure optimum bond between the transducer and the corresponding step on the optical element. This method can be particularly useful for creating an array with a plurality of transducers, as it allows for the process to be automated and ensures a consistent and accurate result.

The use of pneumatically actuated spreaders also offers other advantages over manual methods, such as greater speed, efficiency, and repeatability. It can also reduce the risk of human error and variability in the epoxy spreading process, which can lead to more consistent and reliable results.

Using pneumatically actuated spreaders to create a transducer array with each transducer at a different height can be a viable option for applications that require precise and uniform positioning of the transducers. The suitability of this method will depend on the specific requirements of the application and the available resources and expertise.

Attaching the crystals or transducers to the layer of gold on the optical element can be done through several methods, including ultrasonic bonding, thermal compression bonding, or epoxy bonding.

Ultrasonic bonding involves placing the crystal or transducer onto the layer of gold and using ultrasonic waves to generate heat and create a bond between the two materials. This method is commonly used for smaller crystals and transducers.

Thermal compression bonding involves applying heat and pressure to the crystal or transducer, causing it to bond with the layer of gold. This method is commonly used for larger crystals and transducers.

Epoxy bonding involves applying a small amount of epoxy adhesive to the crystal or transducer and placing it onto the layer of gold. The adhesive is then cured, creating a strong bond between the crystal or transducer and the gold layer.

Regardless of the method used, care should be taken to ensure that the crystal or transducer is properly aligned with the gold layer to ensure optimal performance of the opto-acoustic deflector.

The thickness of the epoxy layer used to attach the crystals to the layer of gold in an opto-acoustic deflector must be as thin as possible for several reasons:

Minimizing acoustic attenuation: The epoxy layer can attenuate the acoustic wave generated by the transducer, which can reduce the deflection efficiency of the device. A thinner epoxy layer can minimize the attenuation of the acoustic wave and improve the device's performance.

Avoiding acoustic interference: The epoxy layer can also cause acoustic interference, particularly if it is too thick. This interference can result in unwanted diffraction or scattering of the acoustic wave, which can also reduce the device's performance. A thinner epoxy layer can help to avoid this problem.

Minimizing optical distortion: The epoxy layer can also introduce optical distortion due to its refractive index. This distortion can be particularly problematic if the optical element is used in a laser beam steering application where precise control of the beam direction is critical. A thinner epoxy layer can help to minimize this distortion and improve the device's performance.

Overall, a thinner epoxy layer can help to improve the efficiency, accuracy, and reliability of an opto-acoustic deflector.

The process of applying an ultra-thin layer of epoxy involves several steps, including:

Preparation: The surface of the gold layer on the optical element must be thoroughly cleaned to remove any contaminants that may interfere with the adhesion of the epoxy. This can be done using a combination of solvents and ultrasonic cleaning.

Mixing: The epoxy is typically a two-part adhesive that must be mixed together in precise proportions. This is often done using a syringe or other dispensing device to ensure accuracy.

Dispensing: Once mixed, the epoxy is dispensed onto the surface of the gold layer. To achieve an ultra-thin layer, a dispensing device with a small aperture is typically used.

Spreading: The epoxy is spread evenly across the surface of the gold layer using a micro-manipulator or other precision tool. This must be done carefully to avoid creating air bubbles or other imperfections.

Curing: Once the epoxy has been applied, it must be cured according to the manufacturer's instructions. This typically involves heating the optical element to a specific temperature for a set amount of time.

By using precise dispensing and spreading techniques, it is possible to apply an ultra-thin layer of epoxy that is only a few microns thick. This is important for acousto-optic devices because it minimizes any interference that the epoxy layer may have on the performance of the device.

Delamination of the gold layer and epoxy failure can both be potential issues in the manufacturing process of an opto-acoustic deflector. Gold delamination can occur due to poor adhesion between the gold layer and the optical element's surface. This can be caused by inadequate cleaning of the surface before deposition, or by the use of inappropriate conditions during the deposition process. If the gold layer delaminates, it can cause the crystals to detach from the surface, resulting in the failure of the entire device. Epoxy failure can occur due to a number of factors. One issue can be improper mixing of the epoxy, leading to inconsistencies in the hardness and adhesive properties of the epoxy. Another issue can be the use of too much or too little epoxy, which can affect the bonding strength and stability of the crystals. In addition, if the epoxy layer is too thick, it can lead to acoustic wave attenuation, reducing the efficiency of the opto-acoustic deflector.

If the epoxy layer is too thick, it can create several issues in the opto-acoustic deflector. Firstly, a thick layer of epoxy can cause an uneven surface, which can affect the optical properties of the deflector. This can result in distortion, scattering, or attenuation of the laser beam passing through the deflector. Secondly, a thick layer of epoxy can increase the distance between the crystal and the gold layer, which can affect the efficiency of the acousto-optic interaction. This can result in lower deflection efficiency, higher power consumption, or increased heat generation.

Additionally, a thick layer of epoxy can cause mechanical stress on the crystal and the gold layer. As the epoxy cures, it can generate heat and shrink, which can cause the crystal or the gold layer to deform or crack. This can affect the stability, reliability, and lifetime of the opto-acoustic deflector.

To avoid these potential problems, it is important to apply a thin and uniform layer of epoxy on the steps of the deflector surface. This can be achieved by using a precision dispenser, a flat blade or a roller to spread the epoxy evenly. The thickness of the epoxy layer should be controlled within a certain range, depending on the type and viscosity of the epoxy, the height and pitch of the steps, and the required optical and mechanical properties of the deflector. Typically, the thickness of the epoxy layer can be in the range of a few micrometers to tens of micrometers, depending on the application requirements.

In one embodiment, a method for securing crystals to a gold plated optical element includes:

- placing each crystal on a moveable pedestal mounted on a piston;
- temporarily securing each crystal to the moveable pedestal;
- applying an epoxy to a plurality of steps on a deflector surface;
- placing the piston with the crystals over the plurality of steps;
- actuating the piston and moving each moveable pedestal to contact the crystal with the epoxy;
- releasing the crystal from the moveable pedestal; and
- curing the epoxy to secure the crystal to the steps.

The method for securing crystals to a gold plated optical element using epoxy involves the following The method for securing crystals to a gold plated optical element using epoxy involves the following steps:

Placing each crystal on a moveable pedestal mounted on a piston: The crystals are carefully placed on a moveable pedestal which is mounted on a piston that is capable of moving up and down.

Temporarily securing each crystal to the moveable pedestal: To prevent the crystals from falling off during the assembly process, they are temporarily secured to the moveable pedestal using a small amount of wax or adhesive.

Applying an epoxy to a plurality of steps on a deflector surface: A small amount of epoxy is applied to a plurality of steps on the deflector surface. It is important to apply the epoxy thinly and evenly to avoid any inconsistencies in the final assembly.

Placing the piston with the crystals over the plurality of steps: The piston, with the crystals mounted on the moveable pedestals, is carefully lowered over the plurality of steps on the deflector surface.

Actuating the piston and moving each moveable pedestal to contact the crystal with the epoxy: The piston is actuated to move each moveable pedestal, and the crystals are brought into contact with the epoxy on the steps of the deflector surface.

Curing the epoxy to secure the crystal to the steps: Once the crystals are in place, the epoxy is cured. This is typically done by heating the assembly to a specific temperature for a specified amount of time. The curing process ensures that the crystals are securely attached to the deflector surface.

It is important to note that the entire assembly process should be carried out in a clean environment, free of dust and other contaminants, to avoid any potential issues with the final product. Additionally, care should be taken to ensure that the crystals are properly aligned with the deflector surface to avoid any misalignment issues during use.

Due to the steps with variable heights, the piston is a gimbal that can move in x and y axis to apply controlled pressure to the crystals and to spread the epoxy as thin as possible. The use of a gimbal allows for precise movement of the piston in both the x and y directions, which helps to ensure that each crystal is pressed evenly onto the deflector surface even where different step heights are involved, and that the epoxy is spread evenly across the steps. This is important for achieving a strong and reliable bond between the crystals and the deflector surface, as well as for ensuring that the crystal positions are aligned correctly. The gimbal can also be used to adjust the pressure and angle of the crystals, which can be important for optimizing the performance of the opto-acoustic deflector.

Figure 5:
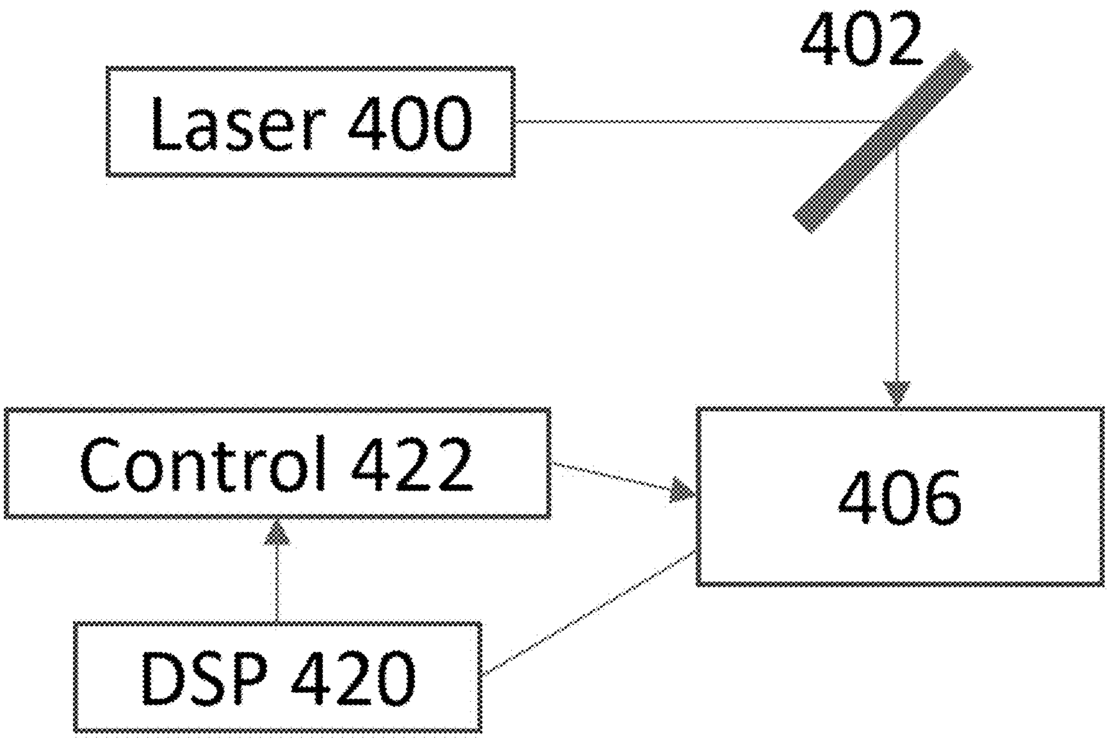
FIG. 5 shows an exemplary opto-acoustic laser system.

FIG. 5 shows an exemplary opto-acoustic laser system, which is a type of system that combines optical and acoustic techniques for a range of applications, such as sensing, imaging, and spectroscopy. Some of the main components of an opto-acoustic laser system include:

- Laser source 400: A laser source is used to generate the optical radiation that interacts with the sample. Different types of lasers can be used, depending on the specific application, such as pulsed or continuous wave (CW) lasers.
- Optical components: 402 Optical components are used to guide, focus, and manipulate the laser beam. These may include mirrors, lenses, polarizers, and filters.
- Acoustic transducers 406: Acoustic transducers are used to generate and detect acoustic waves that are produced by the interaction of the laser beam with the sample. These can be piezoelectric transducers, optical fibers, or other types of sensors. A sample chamber is the region where the laser beam interacts with the sample. Preferably the sample chamber is inside an optical element such as element 10 of FIG. 2, but in other applications the sample chamber can be a gas cell, a liquid cell, or a solid-state sample holder, depending on the application.
- Signal processing and data acquisition 420: Signal processing and data acquisition systems are used to analyze the acoustic signals generated by the interaction of the laser beam with the sample. These systems may include amplifiers, filters, and data acquisition cards.
- Control electronics 422: Control electronics are used to synchronize the laser and acoustic pulses, as well as to control the various components of the system, such as the laser power, acoustic frequency, and detection settings.

The phased array opto-acoustic system is a type of opto-acoustic imaging system that uses an array of optical and acoustic elements to generate and detect acoustic waves for imaging and sensing applications.

When an RF frequency acoustic wave propagates inside an optically transparent medium, a periodic change in the refractive index occurs due to the compressions and rarefactions of the sound wave. This periodic variation produces a grating capable of diffracting an incident laser beam.

Two types of diffraction can occur:

Operation as a Raman-Nath device occurs when the laser beam enters the sound field at normal incidence and the light-sound interaction length $L<\Lambda^2/A$, where A is the laser wavelength in the medium and $\Lambda$ is the sound wavelength which is analogous to the line spacing of a thin diffraction grating. Klein and Cook[1] have defined a parameter Q $$Q = 2\pi\lambda LF^2/nV^2$$

where Fis the RF acoustic frequency, n the index of refraction, and V the acoustic velocity of the interaction medium. For a Q value of approximately 4 or less operation is said to be in the Raman-Nath region. Operation in this mode is characterized by the fact that many diffracted orders are generated and the maximum amount of light in any of the diffracted orders is limited to approximately 35 percent. This type of device is typically used as a loss modulator for intracavity applications that require light to be removed from the zero order or undiffracted beam passing straight through the device; for applications such as q-switching.

Operation as a Bragg device occurs when $L>\Lambda^2/\lambda$ or according to Klein-Cook when Q is approximately 7 or greater. In this mode the incident laser beam should enter the sound field at the Bragg angle $$\theta_B = \lambda/2\Lambda$$

Maximum diffraction efficiency occurs when the incident laser beam and the first order diffracted beam are adjusted to form symmetrical angles with respect to the acoustic wavefronts. Depending upon design, up to 90 percent of the incident light can be diffracted into one order. Since acousto-optic devices are not 100 percent efficient, all of the light cannot be removed from the zero order. Since no light remains in the first order when the sound power is removed, the first diffracted order is used in applications such as amplitude modulation which require a high extinction ratio.

Amplitude modulation is detailed next. Beam separation or angular deviation between zero and first order is twice the Bragg angle $$\theta = 2\theta_B = \lambda F/V$$

The separation is proportional to acoustic frequency with a higher center frequency giving greater separation. The percentage of light 11 in the first order or diffraction efficiency is given by $$\eta = I_1/I = \sin^2\left(2.22\left[1/\lambda^2(L/H)M_2P_a\right]^{1/2}\right)$$

Diffraction efficiency is proportional to acoustic power (Pa), acousto-optic interaction material figure of merit (M2), sound field length to height aspect ratio (UH), and inversely proportional to the square of the optical wavelength (1/0.2).

Since the diffraction process is a $\sin^2$ function please note that it is possible to overdrive the modulator resulting in decreased diffraction efficiency. Also note that since efficiency is inversely proportional to optical wavelength, longer wavelengths will require more RF drive power (P), and shorter wavelengths will require less RF drive power. Drive power can be determined for optical wavelengths different from the test condition wavelength by $$P_1/P_2 = k(\lambda_1/\lambda_2)^2$$

Rise time, Tr, is the time interval for the light intensity to go from 10% to 90% of maximum value in response to an acoustic step function. Rise time for a Gaussian laser beam is given by $$Tr = 0.64\,D/V = 0.64T$$

where Tis the transit time of the acoustic wave across a laser beam of diameter D.

The frequency response of an acousto-optic modulator can be characterized by the modulation index or depth of modulation (M) which can be calculated for a sinusoidal input $$M = \exp\left(-\pi^2 f_m^2 \tau^2 /8\right).$$

The 50% depth of modulation or −3 db modulation bandwidth occurs when fmT=0.75 where fm is modulation frequency.

When viewing photodiode current (see FIG. 5) on an oscilloscope, the Depth of Modulation can be calculated from the maximum intensity (Imax) and minimum intensity (Imin) readings displayed $$M = (Imax - Imin)/(Imax + Imin)$$

or in terms of contrast (C) where $$C \equiv I_{max}/I_{min}$$

$$M = (C-1)/(C+1)$$

Optical frequency shifting can be done. Because the acoustic wave travels across the optical beam, the optical frequency undergoes a Doppler shift by an amount equal to the acoustic frequency. The Modulator can up-shift or down-shift the optical frequency depending on the orientation of the optical beam in relation to the sound field. If the laser beam enters the sound field at the Bragg angle in opposition to the direction of the sound field, the optical frequency is up-shifted (plus first order) and if the beam enters at the Bragg angle in the same direction as the sound field, the optical frequency is down-shifted (minus first order).

Deflection is detailed next. Since the angular position of the first order beam is proportional to acoustic frequency, an incremental frequency change will produce an incremental angular deviation $$\Delta\theta = \lambda\Delta F/V$$

Total deviation is limited by the transducer electrical bandwidth.

Deflector resolution N, the number of resolvable beam positions across the total scan angle is defined as the total scan angle divided by the diffraction spread of the laser beam. For a uniformly illuminated optical beam $$N = (\lambda\Delta F/V)/(\lambda/D) = (D/V)\Delta F = \tau\Delta F$$

Since r is the transit time of the acoustic wave across the beam diameter D and IIF is the RF bandwidth of the device, the product of the two is called Time Bandwidth product. Since r is the time for sound to fill or clear the optical aperture, it limits the spot position access time in a random access application.

The far field light intensity pattern for the deflected beam is a (sin x/x)2 function. By the Rayleigh Criterion the above resolution occurs when the maximum intensity at one beam position coincides with the intensity minimum at an adjacent beam position.

Changing frequency from the nominal center RF frequency to deflect the laser beam destroys the Bragg angle symmetry condition for efficient diffraction efficiency, resulting in reduced diffraction efficiency at the edges of the scan bandwidth. Incorporating acoustic phased array beam steering in the deflector design will maintain a high diffraction efficiency across the total deflection bandwidth since the acoustic wavefronts effectively rotate in response to a change in frequency to maintain the proper Bragg condition. Acoustic phased array beam steering is accomplished by mechanically cutting into the glass a series of small steps which are one half of an acoustic wavelength high at center frequency and phasing adjacent piezoelectric transducers 180 degrees apart. This technique causes the acoustic wavefronts to effectively rotate in response to a change in applied RF frequency. Because of the beam steering high uniform diffraction efficiency occurs only on one side of the zeroth order beam as the RF frequency is swept from minimum to maximum. On the opposite side of zero order the Bragg condition is satisfied for only one frequency. As the RF frequency is repetitively swept across the entire range, the position for high diffraction efficiency will change in response to mechanically rotating the deflector.

In linear scanning applications where T, total scan time, is short, a frequency gradient is produced across the optical aperture. The frequency gradient acts like a cylinder lens of fixed focal length fl=VT/68, either converging or diverging the diffracted beam. If total scan time T is short, the cylinder effect will preclude bi-directional scanning. The effect can be compensated for in a unidirectional fixed scan rate system by adjusting the beam shaping optics used to expand D for resolution purposes.

Multiple beam generation is detailed next. Every acoustic frequency in an acousto-optic device defines a unique angular beam position. If several acoustic frequencies are applied simultaneously to the acousto-optic device, a corresponding number of diffracted beams will be created.

Separation between beams is $$\Delta\theta = \lambda\Delta F/V$$

where ΔF is the acoustic frequency difference between diffracted beams. Each beam can be modulated independently but the intensities of the beams are interrelated.

One AOD deflector embodiment operates at 40 MHz and 60 MHz with high efficiency and equal intensity. Optical grade, single crystal Germanium is used for the interaction medium and Lithium Niobate piezoelectric transducers are used to generate the RF frequency acoustic traveling wave inside the Germanium.

The RF center frequency of operation is 50 MHz and the height of the sound field or active aperture is 10 mm. RF frequencies of operation are 40 MHz and 60 MHz. The Germanium optical surfaces are coated with a multi-layer dielectric antireflection coating designed for operation at 9.4 μm. In this embodiment, the pulse rise time, Tr (10% to 90%), and depth of modulation are determined by the light beam diameter D. For Model AGD-5147 with acoustic velocity V=5.5 mm/μsec $$Tr = 117 D nsec$$

where D is in mm. Modulation response for sinusoidal inputs can be calculated as $$M = \exp\left(-4.08 \times 10^{-2} D^2 f_m^2\right)$$

where D is beam diameter in mm and fm is modulation frequency in MHz. For a deflector, a large beam width is required to obtain full resolution. This precludes operation as a high speed modulator.

The frequency shift range is plus or minus 40 MHz to 60 MHz depending on whether the plus or minus diffracted order is used. The Deflector produces two first order, diffracted, optical beams with an angular separation of 34.2 mad. At 9.4 um, a frequency deviation of 20 MHz centered at 50 MHz will produce an angular separation of 34.2 milliradians centered 85.4 milliradians from the undeflected light. The two optical beams can be individually amplitude modulated.

The optical beam is aligned parallel to the sound field and adjust the vertical position to assure that the total optical beam is in the sound field. Initially, set the device 10 optical face nearly normal to the light beam, apply 50 watts RF power at 60 MHz and rotate the device to adjust the Bragg angle so that optimum first order light intensity is obtained. Change RF frequency to 40 MHz with 50 watts RF power and note the diffraction efficiency. The 40 MHz and 60 MHz efficiencies should be close. Slightly adjust the Bragg angle condition so that equal intensities are obtained at both RF frequencies. After equal intensities are obtained, adjust RF drive power to 120 Watts. Once again check both efficiencies. A slight adjustment may be needed to obtain equal intensities. The zero and unwanted diffraction orders can be spatially filtered with an aperture.

Figure 2B:
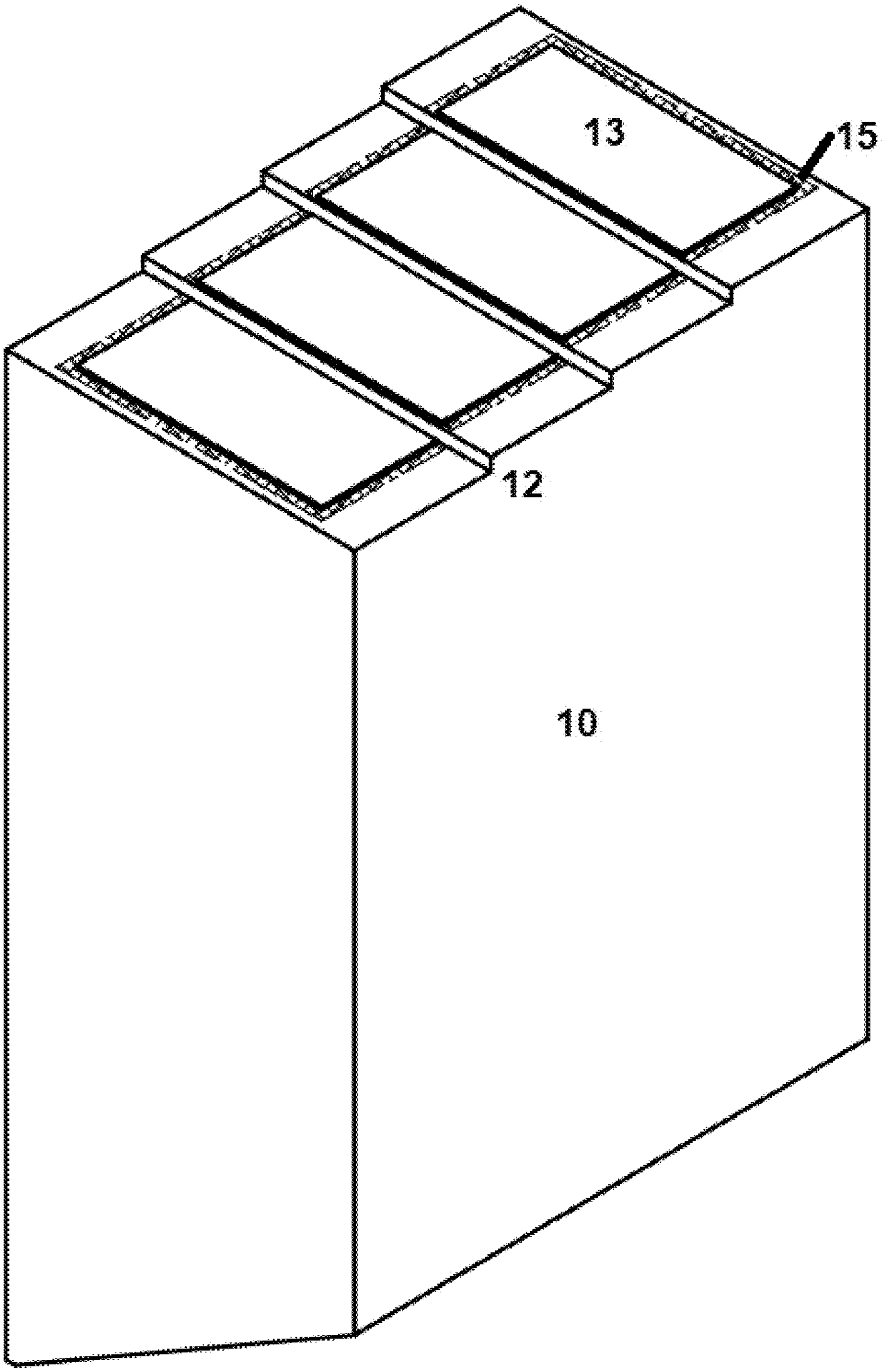

The device of FIG. 2 can be used in a number of applications. For example, the device can be used in laser modulators and deflectors which are devices used in laser systems to modify the behavior of laser beams. The laser modulator is a device that changes the properties of a laser beam as it propagates through a medium. It can be used to control the intensity, phase, or polarization of the beam. The modulators can be made using materials that have nonlinear optical properties, such as lithium niobate, which allows for the manipulation of the laser beam. The laser deflector is a device that changes the direction of a laser beam. It can be used to steer the beam to a particular location or to scan the beam over a surface.

In the context of optics and telecommunications, modulation refers to the process of intentionally modifying a signal (e.g., light) by varying one or more of its properties, such as amplitude, frequency, or phase. This can be used for a variety of purposes, including deflection and shifting of the signal. For example, in acousto-optic modulation, a signal is deflected or shifted by using an AOD to apply a varying acoustic wave to a crystal, which in turn alters the refractive index and deflects or shifts the light passing through it. Similarly, in electro-optic modulation, a voltage is applied to a crystal to change its refractive index and modulate the light passing through it. These types of modulation can be used in a variety of applications, such as telecommunications, signal processing, and laser machining.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A radio frequency (RF) system, comprising:

a Variable Gain Amplifier (VGA) configured to control the overall gain of the RF power; an amplifier providing a fixed gain to a pre-amp stage;

a multi-stage amplification system including a large signal driver stage and a final stage delivering the RF power signal;

bi-directional couplers positioned between the final amplifier stage and the RF power output, enabling the sampling of forward and reverse power;

RF power detectors converting sampled power into a DC voltage equivalent for feedback and control purposes; and a controller managing gain, bias currents, and shutdown based on feedback from the RF power detectors an acousto-optics device with:

an optical element having a surface with one or more steps formed thereon;

a conductive layer formed on the surface with the steps;

one or more crystals secured to each step; and electrodes positioned on each surface of each crystal.

2. The system of claim 1, wherein the controller regulates a gain of the VGA and sets bias currents for one or more amplifier stages with a Digital-to-Analog Converter (DAC) for compensation over a predetermined operating temperature range.

3. The system of claim 1, comprising an amplification stage coupled to the controller to deliver variable drive power levels to provide scalability for one or more operational requirements.

4. The system of claim 1, wherein the controller initiates an immediate shutdown of an RF driver upon detecting one or more predetermined forward or reflected power levels using feedback received from the RF power detectors.

5. The system of claim 1, comprising a serial communication interface enabling exchange of system health and status information between the microcontroller and an external controller.

6. The system of claim 1, comprising, comprising and AOD with:

an optical element having a surface with one or more steps formed thereon;

a conductive layer formed on the surface with the steps;

one or more crystals secured to each step; and electrodes positioned on each surface of each crystal.

7. The system of claim 1, comprising a tuning element to match a predetermined impedance.

8. The system of claim 1, comprising a tuning element providing an output impedance of 50 ohms.

9. The system of claim 1, comprising a tuning element including inductive and capacitive passive components.

10. The system of claim 1, comprising tuning element comprises 1:1 balun, 4:1 transformer, a capacitor, and an inductor.

11. A method to deflect a laser beam, comprising:

applying the laser beam to an optical element having one or more steps each with a predetermined height and one or more crystals or transducers on the one or more steps formed thereon; a conductive layer formed on the surface with the steps; one or more crystals secured to each step; and electrodes positioned on each surface of each crystal;

impedance matching the electrical input of the transducers to a 50-ohm load;

providing an electrical input to deflect the laser at the two or more frequencies; and generating a sound field in the optical element to deflect a laser beam based on two or more frequencies;

controlling the crystals or transducers with a controller, a Variable Gain Amplifier (VGA) configured to control the overall gain of the RF power, an amplifier providing a fixed gain to a pre-amp stage, a multi-stage amplification system including a large signal driver stage and a final stage delivering the RF power signal, a bi-directional couplers positioned between the final amplifier stage and the RF power output, enabling the sampling of forward and reverse power, RF power detectors converting sampled power into a DC voltage equivalent for feedback and control purposes, wherein the controller manages gain, bias currents, and shutdown based on feedback from the RF power detectors.

12. The method of claim 11, comprising controlling the crystals or transducers with a controller, a Variable Gain Amplifier (VGA) configured to control the overall gain of the RF power, an amplifier providing a fixed gain to a pre-amp stage, a multi-stage amplification system including a large signal driver stage and a final stage delivering the RF power signal, a bi-directional couplers positioned between the final amplifier stage and the RF power output, enabling the sampling of forward and reverse power, RF power detectors converting sampled power into a DC voltage equivalent for feedback and control purposes, wherein the controller manages gain, bias currents, and shutdown based on feedback from the RF power detectors.

13. The method of claim 11, comprising matching the input of the transducers to a predetermined impedance.

14. The method of claim 11, comprising providing a tuning element coupled to the transducers with an output impedance of 50 ohms.

15. The method of claim 11, comprising a tuning element including inductive and capacitive passive components.

16. The method of claim 11, comprising tuning element comprises a 1:1 balun, a 4:1 transformer, a capacitor, and an inductor.

17. The method of claim 11, wherein the optical element comprises a slanted end, wherein the slanted end comprises a compound angle to move reflected sound field out of a laser beam working range, wherein the slanted end forms a 30 degree angle measured from a long side of the optical element to a short side of the optical element, and wherein a surface of the slanted end comprises a 2 degree slope.

18. The method of claim 11, wherein the optical element comprises germanium, tellurium dioxide ($TeO_2$), lithium niobate, PZT, fused silica, chalcogenide glasses, glass.

19. The method of claim 11, wherein the tuning element matches a deflector output impedance at 40 MHz and at 60 MHz to a 50 ohm impedance.

20. The method of claim 11, comprising providing gain adjustment, temperature compensation, and autonomous fault recovery capabilities with an RF power amplifier having redundant fault detection for excessive forward and reverse power with a measurement-based power detection means and a threshold-based power detection means, and monitoring an operating temperature to maintain consistent RF power output.

* * * * *